United States Patent
Li

(10) Patent No.: US 11,283,661 B2
(45) Date of Patent: Mar. 22, 2022

(54) METHOD AND APPARATUS FOR SIGNAL PROCESSING

(71) Applicant: DATANG MOBILE COMMUNICATIONS EQUIPMENT CO., LTD., Beijing (CN)

(72) Inventor: Qinghua Li, Beijing (CN)

(73) Assignee: DATANG MOBILE COMMUNICATIONS EQUIPMENT CO., LTD., Beijing (CN)

(*) Notice: Subject to any disclaimer, the term of this patent is extended or adjusted under 35 U.S.C. 154(b) by 69 days.

(21) Appl. No.: 16/651,333

(22) PCT Filed: Aug. 23, 2018

(86) PCT No.: PCT/CN2018/102013
§ 371 (c)(1),
(2) Date: Mar. 26, 2020

(87) PCT Pub. No.: WO2019/062406
PCT Pub. Date: Apr. 4, 2019

(65) Prior Publication Data
US 2020/0235972 A1  Jul. 23, 2020

(30) Foreign Application Priority Data
Sep. 26, 2017 (CN) .......................... 201710884795.0

(51) Int. Cl.
*H04L 27/26* (2006.01)
*H03H 17/06* (2006.01)
*H03H 17/00* (2006.01)

(52) U.S. Cl.
CPC .......... *H04L 27/264* (2013.01); *H03H 17/06* (2013.01); *H04L 27/2607* (2013.01); *H04L 27/2634* (2013.01); *H03H 2017/0081* (2013.01)

(58) Field of Classification Search
CPC ............... H03H 17/0213; H03H 17/06; H03H 17/0269; H03H 2017/0081;
(Continued)

(56) References Cited

U.S. PATENT DOCUMENTS 7,061,970 B2 * 6/2006 Reed .................. H04B 1/70718
  370/232
7,907,512 B1   3/2011 Von Der Embse
(Continued)

FOREIGN PATENT DOCUMENTS

CN   101917373 A   12/2010
CN   104615877 A    5/2015
(Continued)

OTHER PUBLICATIONS

Nokia et al., "Performance of Interleave Division Multiple Access (IDMA) in Combination with OFDM Family Waveforms", 3GPP TSG-RAN WG1#85, Nanjing, P.R. China, May 23-27, 2016, total 6 pages, R1-165021.
(Continued)

*Primary Examiner* — Oussama Roudani
(74) *Attorney, Agent, or Firm* — Kilpatrick Townsend & Stockton, LLP

(57) ABSTRACT

A method and an apparatus for signal processing: implementing step-by-step orthogonal decomposition of an original signal to be inputted; on the basis of the number of layers of orthogonal decomposition and the edge high frequency bandwidth of the original signal after orthogonal decomposition, generating a finite-length unit impulse response FIR filter; using the FIR filter to filter the edge high-frequency signal of the original signal; and, after passing the signal obtained after filtering and the low frequency signal
(Continued)

obtained at each stage of orthogonal decomposition through an orthogonal filter bank, implementing signal synthesis processing.

14 Claims, 15 Drawing Sheets

(58) Field of Classification Search
CPC .............. H03H 2240/00; H04W 16/14; H04L 27/2634; H04L 27/2607; H04L 27/264; H04B 1/667

See application file for complete search history.

(56) References Cited

U.S. PATENT DOCUMENTS

| | | | | |
|---|---|---|---|---|
| 2007/0115800 | A1* | 5/2007 | Fonseka | ................ H04L 1/0054 370/208 |
| 2012/0163508 | A1* | 6/2012 | Kuffner | .................. H04L 27/04 375/340 |
| 2013/0129017 | A1* | 5/2013 | Sahin | ...................... H04L 27/00 375/296 |
| 2014/0348252 | A1* | 11/2014 | Siohan | .................. H04L 27/264 375/261 |

FOREIGN PATENT DOCUMENTS

| | | |
|---|---|---|
| CN | 105471800 A | 4/2016 |
| CN | 105740762 A | 7/2016 |
| CN | 105915193 A | 8/2016 |
| CN | 106096154 A | 11/2016 |
| CN | 106405233 A | 2/2017 |
| JP | 2012249294 A | 12/2012 |
| WO | 2017113833 | 7/2017 |

OTHER PUBLICATIONS

Spreadtrum Communications,"Considerations on waveform design for new RAT", 3GPP TSG RAN WGI meeting #84 bis, Busan, Korea, Apr. 11-15, 2016, total 2 pages, R1-162548.

Kumar A et al."An efficient closed-form design method for nearly perfect reconstruction of non-uniform filter bank", ISA Transactions, Instrument Society of America, Pittsburgh, US, vol. 61, total 12 pages, Feb. 6, 2016.

* cited by examiner

METHOD AND APPARATUS FOR SIGNAL PROCESSING

CROSS REFERENCE

This application is a national stage application of International Application No. PCT/CN2018/102013, filed Aug. 23, 2018, which claims the priority of Chinese Patent Application No. 201710884795.0, filed with the Chinese Patent Office on Sep. 26, 2017, and entitled "a method and apparatus for signal processing", both of which are hereby incorporated by reference in their entireties.

FIELD

The present disclosure relates to the field of telecommunications, and particularly to a method and apparatus for signal processing.

BACKGROUND

The spectrum utilization of the long term evolution (hereinafter "LTE") signal system presently in use is 90% and the signal bandwidths unoccupied by the physical resource blocks are used as the transition bands of a filter for a finite impulse response (hereinafter "FIR") filter filtering, to solve the problems of high noise floor caused by the baseband signal output by the physical layer, out-of-band emission and high adjacent channel leakage power ratio (hereinafter "ACLR") in the LTE system. However, in the fifth generation (hereinafter "5G") system the transition width would be 10 MHz-100 MHz if the spectrum utilization is still 90%, wasting resources.

Therefore, the spectrum utilization in the 5G system will be raised to 98%-99%, i.e., the transition width will only occupy 1%-2% of the entire bandwidth. However, suppose the existing methods for generating baseband signals are adopted and a standard FIR filter is used to suppress noises, the order of the FIR filter would be hundreds or even thousands, and according to the Nyquist sampling theorem, the sampling rate of the FIR filter would be more than 100 MSPS for a channel bandwidth of 100 MHz, or more than 1GSPS for a channel bandwidth of 1 GHz.

As such, the use of existing FIR filters in a system where the transition width occupies a tiny percentage of the entire bandwidth would lead to a low spectrum utilization, demand a large amount of resources and make the design of the FIR filters more complicated.

SUMMARY

Embodiments of the disclosure provide a method and an apparatus for signal processing so as to solve the problem that the use of existing FIR filters in a system where the transition width occupies a tiny percentage of the entire bandwidth would lead to a low spectrum utilization, demand a large amount of resources and make the design of the FIR filters more complicated.

An embodiment of the disclosure provides a method for signal processing. The method includes: decomposing an original input signal orthogonally by layer; generating an FIR filter according to number of layers of orthogonal decomposition and edge high-frequency bandwidth of the original input signal after the orthogonal decomposition; filtering an edge high-frequency signal of the original input signal by using the FIR filter; and inputting a signal obtained through the filtering and one or more low-frequency signals obtained through the orthogonal decomposition of each layer into orthogonal filters and then combining signals output by the orthogonal filters.

An embodiment of the disclosure provides an apparatus for signal processing. The apparatus includes at least one processing unit and at least one storage unit. The at least one storage unit stores instructions. The at least one processing unit is configured to execute the instructions to: decompose an original input signal orthogonally by layer; generate an FIR filter according to number of layers of orthogonal decomposition and edge high-frequency bandwidth of the original input signal after the orthogonal decomposition; filter an edge high-frequency signal of the original input signal by using the FIR filter; and input a signal obtained through the filtering and one or more low-frequency signals obtained through the orthogonal decomposition of each layer into orthogonal filters and then combine signals output by the orthogonal filters.

An embodiment of the disclosure provides an apparatus for signal processing. The apparatus includes a decomposition module, which is configured to decompose an original input signal orthogonally by layer; an execution module, which is configured to generate an FIR filter according to number of layers of orthogonal decomposition and edge high-frequency bandwidth of the original input signal after the orthogonal decomposition, and filter an edge high-frequency signal of the original input signal by using the FIR filter; a combination module, which is configured to: input a signal obtained through the filtering and one or more low-frequency signals obtained through the orthogonal decomposition of each layer into orthogonal filters, and then combine signals output by the orthogonal filters.

An embodiment of the disclosure provides a machine-readable non-volatile storage medium. The non-volatile storage medium stores a computer program and when the computer program is executed by a processer, the processer performs the operations of the above-mentioned method for signal processing.

According to the embodiments of the disclosure, the original input signal is decomposed orthogonally, an FIR filter is generated according to the number of layers of the orthogonal decomposition and edge high-frequency bandwidth of the original input signal after the orthogonal decomposition, an edge high-frequency signal of the original input signal is filtered by using the FIR filter, a signal obtained through the filtering and one or more low-frequency signals obtained through the orthogonal decomposition of each layer are input into orthogonal filters and then the signals output by the orthogonal filters are combined. Since the original input signal is decomposed by layer, and the bandwidth of the high-frequency signal obtained through the decomposition is narrower than the bandwidth of the original input signal while the bandwidth of the transition band remains unchanged, the bandwidth of the transition band occupies a larger percentage of the bandwidth of the high-frequency signal. According to the performance index of FIR filter, the smaller the percentage of the occupied bandwidth of the transition band to the occupied bandwidth of the high-frequency signal is, the higher the order of the FIR filter is. The bandwidth of the transition band occupies a larger percentage of the bandwidth of the high-frequency signal after the orthogonal decomposition, therefore, for the FIR filter generated according to the number of layers of the orthogonal decomposition and the edge high-frequency bandwidth of the original input signal after the orthogonal decomposition, the computation complexity is greatly reduced. Furthermore, the FIR filter has a lower order and demands a fewer quantity of resources, and the design process of the FIR filter simpler.

BRIEF DESCRIPTION OF THE DRAWINGS

In order to make the technical solutions according to the embodiments of the disclosure clearer, the drawings to which a description of the embodiments refers will be briefly introduced below. Apparently the drawings to be described below are merely illustrative of some of the embodiments of the disclosure, and those having ordinary skill in the art can derive from these drawings other drawings without making any inventive effort.

DETAILED DESCRIPTION OF THE EMBODIMENTS

In order to make the objects, technical solutions, and advantages of the embodiments of the disclosure clearer, embodiments of the disclosure will be described below in detail with reference to the accompanying drawings. Apparently the embodiments to be described below are only a part but not all of the embodiments of the disclosure. Based upon the embodiments of the disclosure described herein, all other embodiments which can occur to those ordinarily skilled in the art without making any inventive effort shall fall into the scope of the disclosure.

Figure 1:
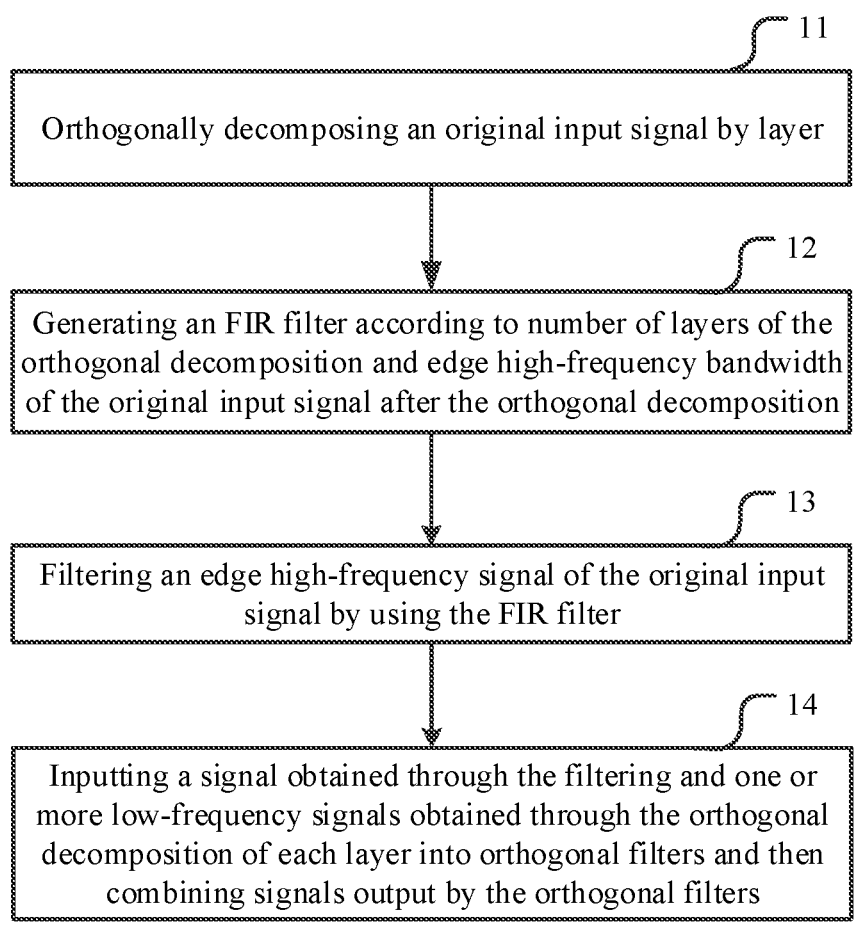
FIG. 1 is a flow chart of a method for signal processing according to an embodiment of the disclosure.

FIG. 1 illustrates a flow of a method for signal processing according to an embodiment of the disclosure:

Operation 11: decomposing an original input signal orthogonally by layer.

Operation 12: generating an FIR filter according to number of layers of orthogonal decomposition and edge high-frequency bandwidth of the original input signal after the orthogonal decomposition.

Operation 13: filtering an edge high-frequency signal of the original input signal by using the FIR filter.

Operation 14: inputting a signal obtained through the filtering and one or more low-frequency signals obtained through the orthogonal decomposition of each layer into orthogonal filters and then combining signals output by the orthogonal filters.

According to the embodiment of the disclosure, the original input signal is decomposed orthogonally, an FIR filter is generated according to the number of layers of the orthogonal decomposition and edge high-frequency bandwidth of the original input signal after the orthogonal decomposition, the edge high-frequency signal of the original input signal is filtered by using the FIR filter, a signal obtained through the filtering and one or more low-frequency signals obtained through the orthogonal decomposition of each layer are input into orthogonal filters and then the signals output by the orthogonal filters are combined. Since the original input signal is decomposed by layer, and the bandwidth of the high-frequency signal obtained through the decomposition is narrower than the bandwidth of the original input signal while the bandwidth of the transition band remains unchanged, the bandwidth of the transition band occupies a larger percentage of the bandwidth of the high-frequency signal. According to the performance index of FIR filter, the smaller percentage of the occupied bandwidth of the transition band to the occupied bandwidth of the high-frequency signal is, the higher the order of the FIR filter is. The bandwidth of the transition band occupies a larger percentage of the bandwidth of the high-frequency signal after the orthogonal decomposition, so for the FIR filter generated according to the number of the layers of the orthogonal decomposition and the edge high-frequency bandwidth of the original input signal after the orthogonal decomposition, the computation complexity is greatly reduced. Furthermore, the FIR filter has a lower order and demands a fewer quantity of resources, and the design process of the FIR filter simpler.

According to an implementation mode of the embodiment of the disclosure, decomposing the original input signal orthogonally includes:

decomposing the original input signal orthogonally to obtain a high-frequency signal at a layer and a low-frequency signal at the layer;

shifting the high-frequency signal at the layer to a zero-frequency signal at the layer and then decimating the shifted signal by a factor of N to obtain a processed high-frequency signal at the layer;

determining if an order of a filter corresponding to the processed high-frequency signal at the layer meets a preset requirement or not; and if the order meets the preset requirement, determining that the orthogonal decomposition is completed;

or, if the order does not meet the preset requirement, decomposing the processed high-frequency signal at the layer orthogonally to obtain a high-frequency signal at another layer and a low-frequency signal at the other layer, and at the other layer, returning to the operation of shifting a high-frequency signal to a zero-frequency signal and then decimating the shifted signal by the factor of N.

Figure 2A:
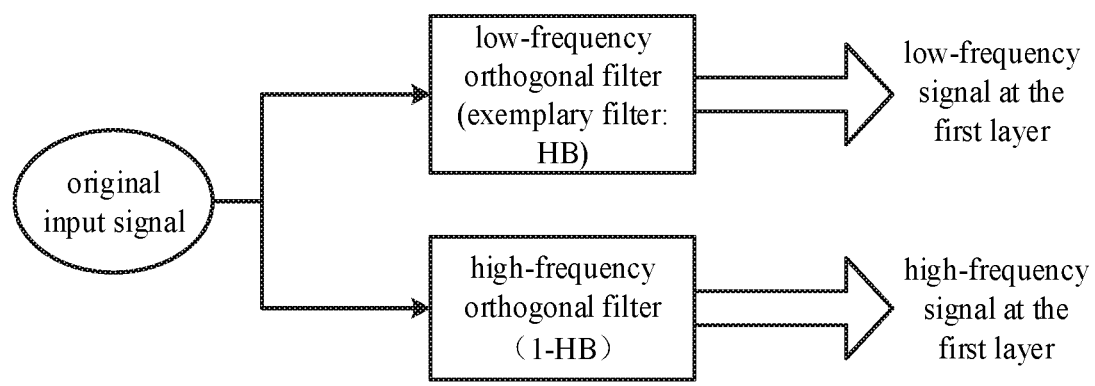
FIG. 2A is a schematic diagram of orthogonal decomposition of an original input signal according to an implementation mode of the embodiment of the disclosure.

The original input signal is decomposed orthogonally to obtain the high-frequency signal at the layer and the low-frequency signal at the layer by being input into a high-frequency orthogonal filter and a low-frequency orthogonal filter, respectively. As illustrated by FIG. 2A, a signal then output by the high-frequency orthogonal filter after the inputting of the original input signal is a high-frequency signal at a first layer, and a signal output by the low-frequency orthogonal filter after the inputting of the original input signal is a low-frequency signal at the first layer.

According to an implementation mode of the embodiment of the disclosure, the low-frequency orthogonal filter may be a half-band filter, and the high-frequency orthogonal filter may be an all-pass filter minus a half-band filter, that is the high-frequency orthogonal filter may be an inversion of half-band filter.

In FIG. 2A, HB represents a low-frequency orthogonal filter; (1-HB) represents a high-frequency orthogonal filter. After the original input signal is input into the low-frequency and high-frequency orthogonal filters, respectively, a low-frequency signal at the first layer is obtained from the HB, and a high-frequency signal at the first layer is obtained from the (1-HB). The frequency effect of the signals is illustrated in FIG. 2B.

Figure 2B:
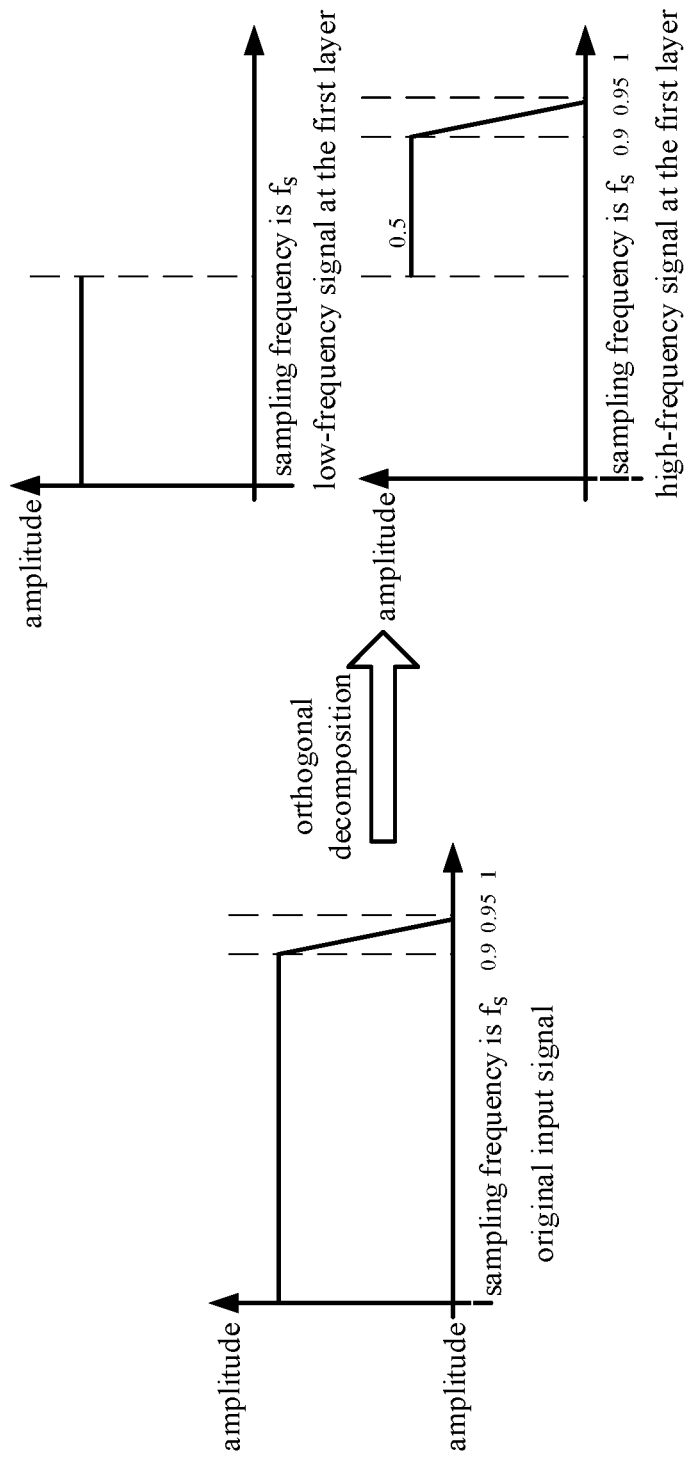
FIG. 2B is a schematic diagram of orthogonal decomposition of frequency of an original input signal according to an implementation mode of the embodiment of the disclosure.
Figure 2C:
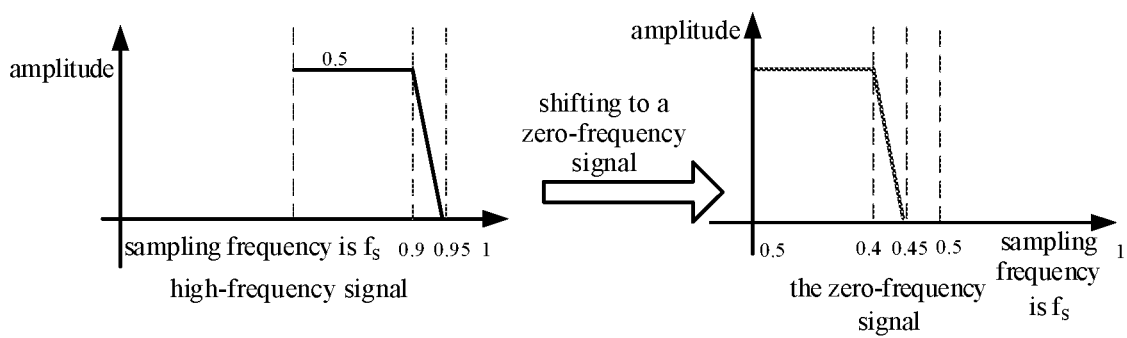
FIG. 2C is a schematic diagram of shifting a high-frequency signal to a zero-frequency signal according to an implementation mode of the embodiment of the disclosure.

FIG. 2C illustrates the shift of the high-frequency signal at the first layer to the zero-frequency signal after the high-frequency signal at the first layer and the low-frequency signal at the first layer are obtained.

After the high-frequency signal at the first layer illustrated by FIG. 2B is shifted to the zero-frequency signal, the percentage of the bandwidth of the transition band to the bandwidth of the high-frequency signal at the first layer to the original input signal is twice as much as the percentage of the bandwidth of the transition band to the bandwidth of the high-frequency to the original input signal, and thus the sampling frequency reduced to half.

The shifted signal is then decimated by a factor of N to obtain the processed high-frequency signal at the first layer.

Optionally, to further improve the degree of suppression of high-frequency signal, after the high-frequency signal is shifted to the zero-frequency signal, the zero-frequency signal may be filtered by a filter whose order is lower than a preset value and then be decimated by a factor of N.

For example, after the above-mentioned operations are performed on a signal whose sampling frequency is $f_s$ and whose transition band is $[f_{pass}, f_{stop}]$, the sampling frequency of the signal becomes $f_s/2$, an equivalent bandwidth is $[0, f_s/4]$, the transition band becomes $[f_{pass}/2-f_s/4, f_{stop}/2-f_s/4]$, and the relative bandwidth becomes $[2*f_{pass}/2-1, 2*f_{stop}/2-1]$.

After obtaining the low-frequency signal at the first layer and the processed high-frequency signal at the first layer, it is needed to determine whether the order of the filter corresponding to the processed high-frequency signal at the first layer meets the preset requirement or not.

The filter corresponding to the processed high-frequency signal at the first layer refers to an FIR filter corresponding to the highest frequency of the processed high-frequency signal at the first layer. The preset requirement may be that the percentage which the transition band's width occupies meets a requirement, that the order of the FIR filter is very low and that the FIR filter demands a relatively small quantity of resources.

If the order of the filter meets the preset requirement, then the orthogonal decomposition is determined to be completed.

Or, if the order of the filter does not meet the preset requirement, then the processed high-frequency signal at the first layer needs to be decomposed orthogonally by using the above-mentioned methods, to obtain a low-frequency signal at a second layer and a processed high-frequency signal at the second layer. Then it is determined whether an order of a filter corresponding to the processed high-frequency signal at the second layer meets the preset requirement or not.

If the order of the filter meets the preset requirement, then the orthogonal decomposition is determined to be completed.

Figure 2D:
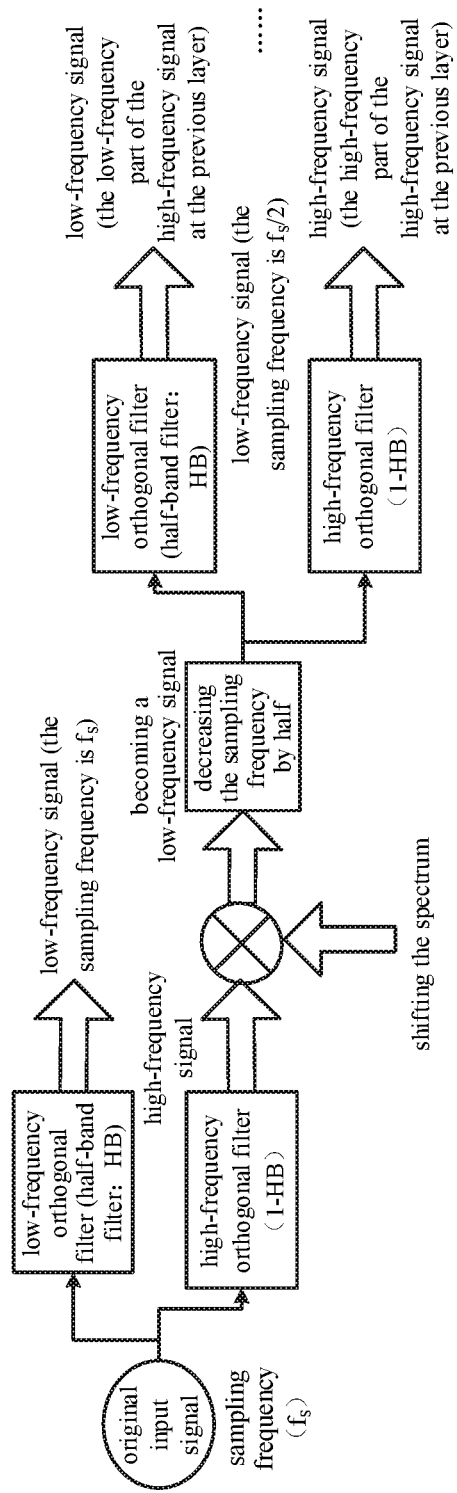
FIG. 2D is a schematic diagram of orthogonal decomposition of an original input signal by layer according to an implementation mode of the embodiment of the disclosure.

Otherwise, as illustrated by FIG. 2D, the processed high-frequency signal at the second layer needs to be decomposed orthogonally by using the above-mentioned methods until an order of a filter corresponding to a processed high-frequency signal at an $M^{th}$ layer meets the preset requirement.

Optionally, after the original input signal has been decomposed orthogonally by layer, the number of layer(s) of the orthogonal decomposition (i.e., the abovementioned M) and edge high-frequency bandwidth of the original input signal after the orthogonal decomposition (i.e., bandwidth of the processed high-frequency signal at the $M^{th}$ layer) are known. An FIR filter can be generated according to the number of layers of the orthogonal decomposition and the edge high-frequency bandwidth of the original input signal after the orthogonal decomposition.

The bandwidth of the transition band of the filter is the same as the bandwidth of the transition band of the original input signal, the passband is a part of an effective signal on a edge sub-band, the relative bandwidth of the transition band becomes larger (a plurality of sub-band signals having small bandwidth would be obtained after the orthogonal decomposition of the original input signal by layer, and the bandwidth of the transition band remains unchanged, so the bandwidth of the transition band occupies a larger percentage compared to the bandwidth of the high-frequency signal), and the effective bandwidth of the signal is appropriate. Therefore, the order of the filter is low and a small quantity of resources is needed.

After the FIR filter is generated, the FIR filter is used to filter the edge high-frequency signal of the original input signal (i.e., the high-frequency signal at the $M^{th}$ layer).

For example, a signal whose sampling frequency is $f_s$ and whose transition band is $[f_{pass}, f_{stop}]$. After the signal is decomposed by layer, the edge high-frequency signal of the original input signal (i.e., the high-frequency signal at the $M^{th}$ layer) is filter by using the FIR filter. In other words, the frequency band $[f_s/2-f_s/2^{M+1}, f_s/2]$ of the original input signal is processed.

A signal obtained through the filtering and the low frequency signal(s) obtained through the orthogonal decomposition at each layer are input into orthogonal filters and then combined into a signal.

Two methods of orthogonally combining the signals according to the embodiment of the disclosure are described below.

The First Method

The signal obtained through the filtering is a high-frequency signal to be processed. Inverse fast Fourier transform (hereinafter "IFFT") is performed on the high-frequency signal to be processed, where IFFT is performed on the high-frequency signal to be processed according to the formula $$f[n] = \frac{1}{N}\sum_{k=0}^{N-1} F[k]e^{j\frac{2\pi}{N}kn} \; 0 \le n < N-1,$$

where N stands for the number of inputs, F[k] represents a time-domain sequence, and f[n] represents a frequency-domain sequence.

The high-frequency signal that has undergone the IFFT is interpolated by a factor of X. The spectrum of the interpolated high-frequency signal is shifted and then the signal is input into an orthogonal filter to obtain a high-frequency signal to be combined.

Baseband sampling of the target low-frequency signal is performed and then IFFT is performed on the signal after zero-padding. Then a cyclic prefix (hereinafter "CP") is inserted into the signal having undergone the IFFT.

The target low-frequency signal refers to a low-frequency signal at the highest decomposition layer among the low-frequency signals which are obtained after the orthogonal decomposition of each layer and which have not been combined with the high-frequency signal to be combined.

The signal having the inserted CP is input into another orthogonal filter to obtain a low-frequency signal to be combined.

The high-frequency signal to be combined and the low frequency signal to be combined are then combined to obtain a combination signal.

It is determined whether there are any low-frequency signals which haven't been combined. If so, use the combination signal as the high-frequency signal to be processed and return to the operation of interpolating the signal to be processed by a factor of X and then shifting the spectrum of the signal. Otherwise, the signal combination is completed.

Figure 3A:
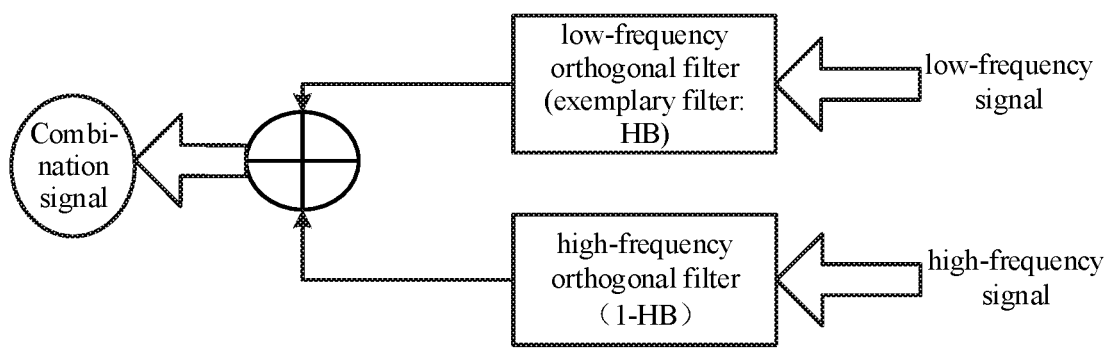
FIG. 3A is a schematic diagram of signal combination by using orthogonal filters according to an implementation mode of the embodiment of the disclosure.

As illustrated by FIG. 3A, inputting the high-frequency signal to be processed into the orthogonal filter to obtain the high-frequency signal to be combined includes inputting the high-frequency signal to be processed into a high-frequency orthogonal filter. And inputting the target low-frequency signal which has undergone baseband sampling into the other orthogonal filter to obtain the low-frequency signal to be combined includes inputting the target low-frequency signal into a low-frequency orthogonal filter.

According to an implementation mode of the embodiment of the disclosure, the low-frequency orthogonal filter may be a half-band filter and the high-frequency orthogonal filter may be an all-pass filter minus a half-band filter.

Widths of the passband and stopband of the half-band filter are the same. The ripples of the stopband and the passband are also the same. Moreover, the polyphaser filtering of the half-band filter combines both filtering and decimation skillfully. As such, when the half-band filter is used as the low-frequency orthogonal filter, comparing with ordinary FIR filters, the number of multiplication operations can be reduced by half approximately, which is very efficiently.

In FIG. 3A, HB stands for the low-frequency orthogonal filter and (1-HB) represents the high-frequency orthogonal filter.

Figure 3B:
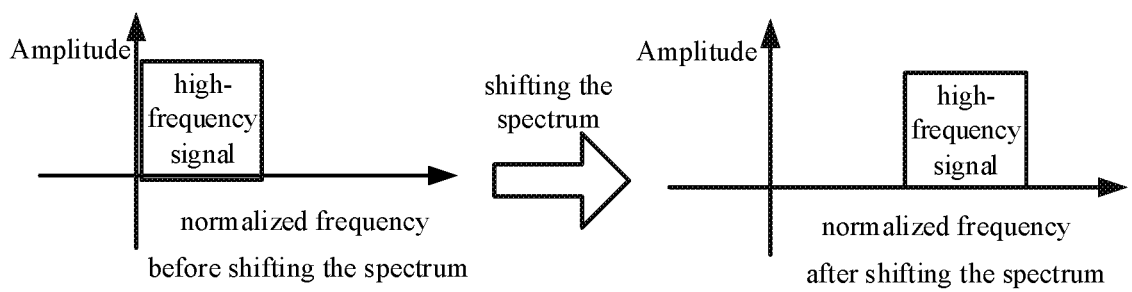
FIG. 3B is a schematic diagram of shifting spectrum of a signal according to an implementation mode of the embodiment of the disclosure.

As illustrated by FIG. 3B, the high-frequency signal to be processed is interpolated by a factor of X, the spectrum of the interpolated high-frequency signal is shifted and then the signal is input into the orthogonal filter to obtain the high-frequency signal to be combined.

As illustrated by FIG. 3B, the spectrum of the high-frequency signal to be processed locates at a low-frequency band. After the spectrum is shifted, the center of the high-frequency signal to be processed locates at a high-frequency band.

For example, the original input signal is denoted by Signal, the sampling frequency is $f_s$ and the transition band is $[f_{pass}, f_{stop}]$. After the spectrum of the high-frequency signal to be processed is shifted, its center is shifted to $f_s/2^{M-1}$. That is, $[f_s/2-f_s/2^{M+1}, f_s/2]$ of Signal is mapped to a frequency band of $[f_s/2^{M+1}, f_s/2^M]$ of signal $S_{M,H2Mix}$, whose bandwidth is $[0, f_s/2^M]$, and the sampling rate becomes $f_s/2^{M-1}$.

Baseband sampling of the target low-frequency signal (i.e., the low-frequency signal at the $M^{th}$ layer) is performed and then IFFT is performed on the signal after zero-padding. Then the CP is inserted into the signal having undergone the IFFT.

The CP is the cyclic prefix of signal transmission, making the signal to be transmitted looks cyclic.

For example, after a signal having 4096 points has undergone the IFFT, the signal becomes x(0)~x(4095), and the $288^{th}$ point is selected for the CP. Then the CP includes x(4096−288)~x(4095), and the signal is to be transmitted in a sequence of x(4096−288)~x(4095), x(0)~x(4095).

The target low-frequency signal refers to a low-frequency signal at the highest decomposition layer after the orthogonal decomposition and it can be obtained in the following two ways.

1. Record the low-frequency signal(s) at each layer when the original input signal is decomposed orthogonally by layer, and then use the recorded low-frequency signal at the highest decomposition layer when combining the signals.

2. Calculate the low-frequency signals(s) at each layer of the orthogonal decomposition of the original input signal. For instance, the frequency band $[f_s/2-2*f_s/2^M, f_s/2-f_s/2^{M+1}]$ of Signal in the example above represents the low-frequency signal at the highest layer. When combination at a lower layer is to be performed, the low-frequency signal at the lower layer needs to be recalculated.

For example, when the frequency distribution of the original input signal ranges from Freq(0) to Freq(4095), the signals obtained through the orthogonal decomposition of the original input signal by layer are as follows.

At the first layer, the original input signal is orthogonally decomposed into: dispose_L(0)=Freq(0)~Freq(2047), and dispose_H(0)=Freq(2048)~Freq(4095).

At the second layer, dispose_H(0) is orthogonally decomposed into: dispose_L(1)=Freq(2048)~Freq(3071) and dispose_H(1)=Freq(3072)~Freq(4095).

At the third layer, dispose_H(1) is orthogonally decomposed into: dispose_L(2)=Freq(3072)~Freq(3583), and dispose_H(2)=Freq(3584)~Freq(4095).

At the fourth layer, dispose_H(2) is orthogonally decomposed into: dispose_L(3)=Freq(3584)~Freq(3839) and dispose_H(3)=Freq(3840)~Freq(4095).

It can be seen from the decomposition process above that the frequency distribution of the signals obtained from decomposition becomes narrower at each layer, i.e., 2048>1024>512>256.

Baseband sampling of the target low-frequency signal is performed according to a certain sampling frequency, where the certain sampling frequency is the sampling frequency of the signal obtained through interpolating the high-frequency signal to be processed by the factor of X.

The signal having the inserted CP is input into the orthogonal filter to obtain the low-frequency to be combined.

Figure 3C:
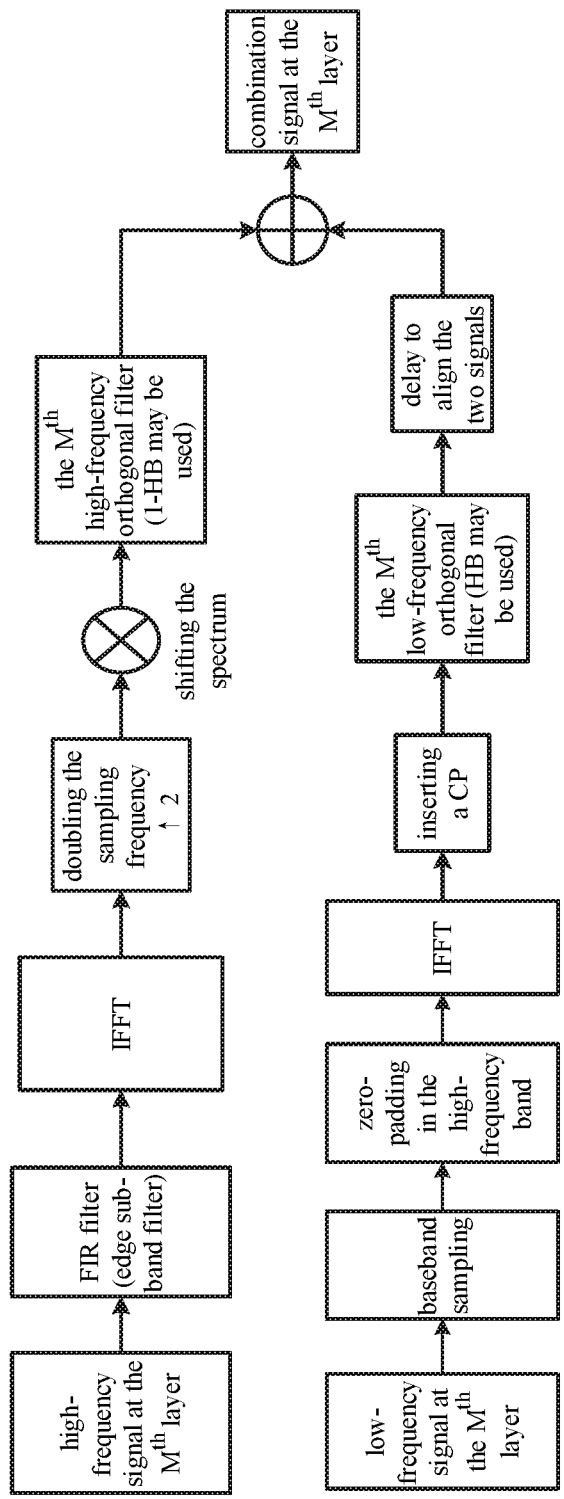
FIG. 3C is a schematic diagram of combining signals at an $M^{th}$ layer according to an implementation mode of the embodiment of the disclosure.
Figure 3D:
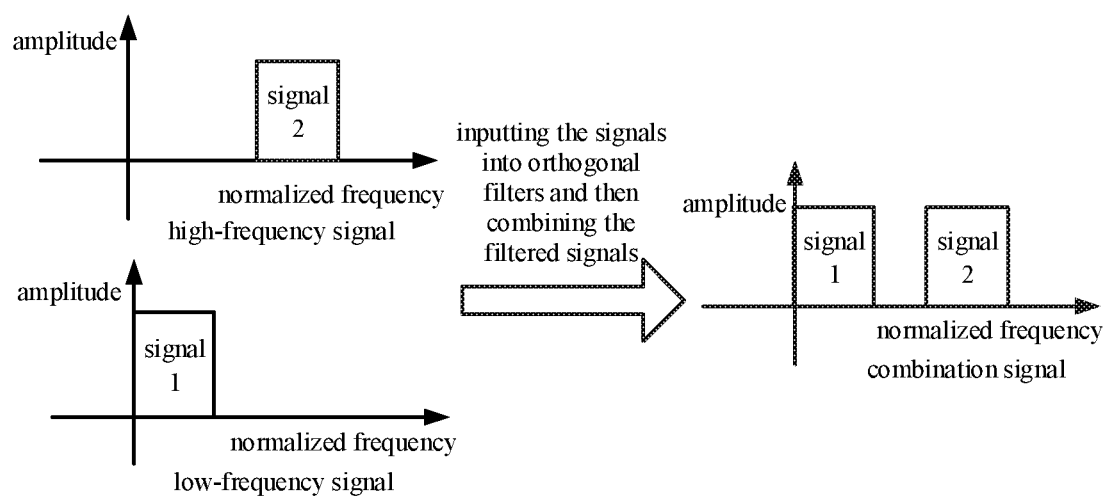
FIG. 3D is a schematic diagram of combining signals at an $M^{th}$ layer according to an implementation mode of the embodiment of the disclosure.

As illustrated by FIG. 3C, the high-frequency signal to be combined and the low-frequency signal to be combined are combined to get the combination signal, and the effect of combining signals is illustrated in FIG. 3D.

In FIG. 3D, the signal 1 represents the high-frequency signal at the $M^{th}$ layer, and the signal 2 represents the low-frequency signal at the $M^{th}$ layer.

Suppose that a signal has a sampling frequency of $f_s$ and a transition band of $[f_{pass}, f_{stop}]$. The combination signal obtained through combining the low-frequency and high-frequency signals at the $M^{th}$ layer maps the frequency band $[f_s/2-f_s/2^M, f_s/2]$ of the original input signal. The sampling frequency of the combination signal is $f_s/2^{M-1}$, and the transition band of the combination signal is the same as the transition band of the original input signal.

Optionally, to align the head frames of the low-frequency signal to be combined and the head frames of the high-frequency signal to be combined, the earlier signal of the two signals can be delayed before the two signals are combined to obtain the combination signal.

Whether it is needed to delay one of the two signals to align the two signals or not depends on the implementation. The point is to take processing delay into consideration. When no processing delay happens during signal processing, both signals are aligned in the first place.

Figure 3E:
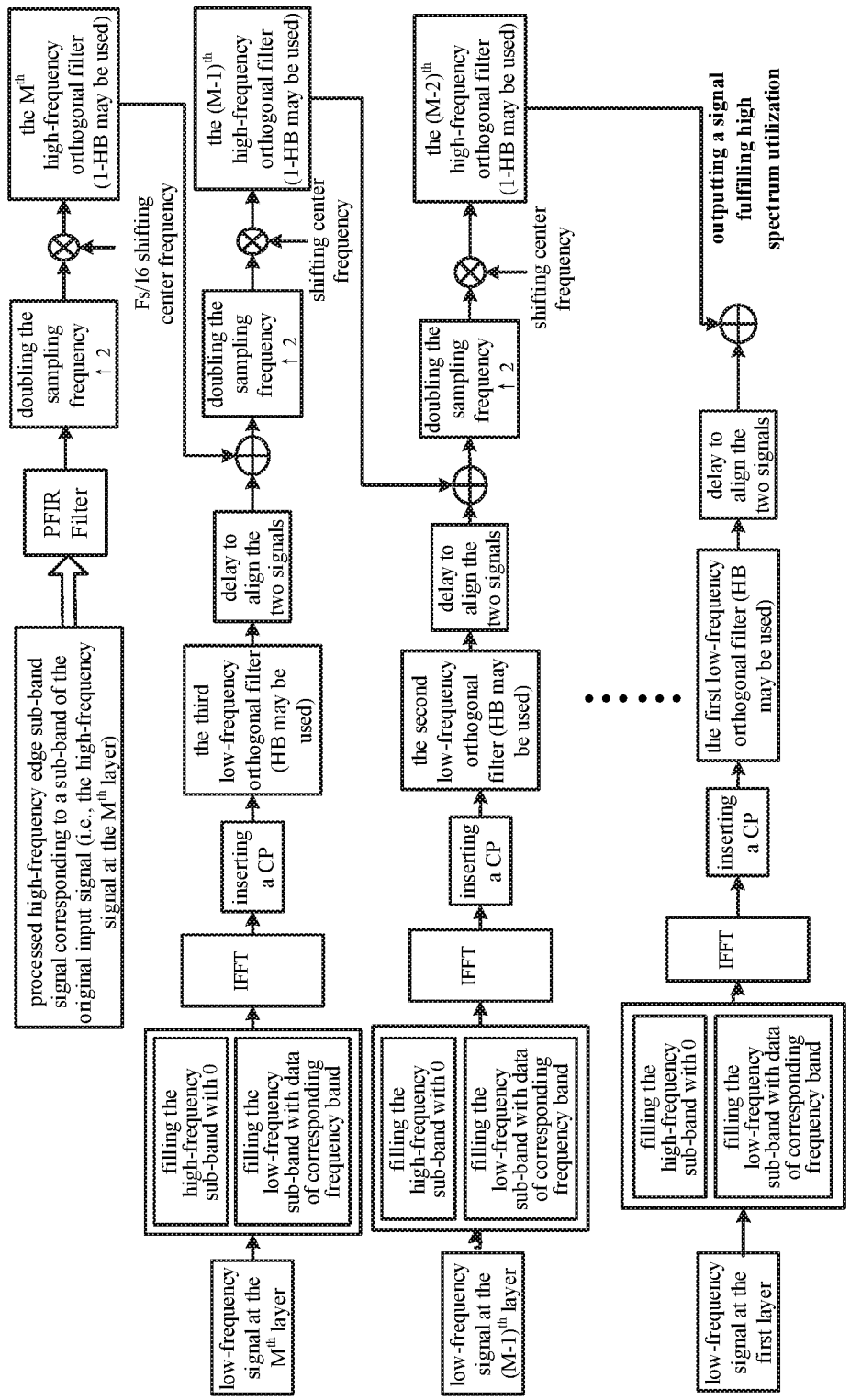
FIG. 3E is a schematic diagram of a first method for combining signals by layer according to an implementation mode of the embodiment of the disclosure.

As illustrated by FIG. 3E, after the low-frequency signal and the high-frequency signal at the $M^{th}$ layer are combined, the combination signal is used as the high-frequency signal at the $(M-1)^{th}$ layer by using the above-mentioned method. Return to the operation of interpolating the high-frequency signal to be processed by the factor of X and shifting the spectrum of the interpolated high-frequency signal so that the high-frequency and low-frequency signals at the $(M-1)^{th}$ layer can be combined. Repeat the process until the high-frequency and low-frequency signals at the first layer are combined.

In FIG. 3E, PFIR: the FIR filter that can be generated according to the layers of orthogonal decomposition and the edge high-frequency bandwidth of the original input signal after the orthogonal decomposition. Doubling the sampling frequency refers to interpolation by a factor of 2. After the combination signal at the $M^{th}$ layer is obtained, the combination signal is used as the high-frequency signal at the $(M-1)^{th}$ layer, and the low-frequency signal at the $(M-1)^{th}$ layer is obtained as mentioned above, and thus are not repeated here in more details. The process is repeated until the high-frequency signal and low-frequency signal at the first layer are combined.

During the combination of signals, it is needed to fill in the positions of actual signals of high-frequency sub-bands at each layer, as well as IFFT carriers and actual signals of high-frequency and low-frequency parts of low-frequency sub-bands at each layer.

For example, when combining signals obtained through a 3-layer orthogonal decomposition, the address of an IFFT carrier whose position the high-frequency part of the low-frequency sub-band at the third layer fills is A/8~(A/4−1). The address of an IFFT carrier whose position the low-frequency part of the low-frequency sub-band at the third layer fills is 0~(A/8−1). The high-frequency part of the low-frequency sub-band at the third layer does not fill the position of an actual signal, whereas the low-frequency part fills the position of the actual signal at [A−2*A/8, A−A/8−1]. The high-frequency sub-band fills in the position of an actual signal at [A−A/8, A−1]. The process is repeated to calculate the positions of actual signals of high-frequency sub-bands at other layers and the addresses of IFFT carriers and positions of actual signals of high-frequency and low-frequency parts of low-frequency sub-bands at the other layers.

During the IFFT, the number of points of IFFT at the third layer is N/4, the number of points of IFFT at the second layer is N/2, and the number of points of IFFT at the first layer is N. The process is repeated to calculate the number of points of IFFT at other layers. It can be seen that during the combination of the signals at the $M^{th}$ layer, all unmapped high-frequency sub-band need to be mapped to perform IFFT, and the number of points equals to a half of the number of IFFT points at the $(M-1)^{th}$ layer. As such, the IFFT at a certain layer can re-use resources of a previous layer, thus fewer resources is demanded.

The Second Method

Fast Fourier transform (hereinafter "FFT") is performed on the original input signal, where the FFT is performed according to the formula below $$F[k] = \Sigma_{n=0}^{N-1} f[n] e^{-j\frac{2\pi}{N}kn} \quad 0 \leq k < N-1,$$

where N is the number of input points, F[k] is a time-domain sequence and f[n] is a frequency-domain sequence.

The original input signal is then decomposed orthogonally by layer. The FIR filter is generated according to the number of layers of orthogonal decomposition and the edge high-frequency signal of the original input signal after the orthogonal decomposition. The edge high-frequency signal of the original input signal is filtered by using the FIR filter, and the signal obtained through the filtering is used as the high-frequency signal to be processed. The high-frequency signal to be processed is interpolated by the factor of X and the spectrum of the interpolated signal is shifted. Then the signal is input into an orthogonal filter to obtain the high-frequency signal to be combined.

Baseband sampling of the target low-frequency signal is performed, and then the sampled signal is input into another orthogonal filter to obtain the low-frequency signal to be combined, where the target low-frequency signal is the low-frequency signal at the highest layer among all the low-frequency signals which have not been combined and are obtained through the orthogonal decomposition of each layer.

The high-frequency signal to be combined and the low-frequency signal to be combined are combined to obtain a combination signal. Then it is determined whether there are any low-frequency signals which have not been combined. If so, the combination signal is used as the high-frequency signal to be processed and the process returns to the operation of interpolating the high-frequency signal to be processed by the factor of X and then shifting the spectrum of the interpolated signal. Otherwise the combination of signals is completed. IFFT of the combination signal obtained after the combination is performed.

Specifically, at first the FFT of the original input signal is performed. Then the orthogonal decomposition of the original input signal is the same as described above, and thus are not repeated here in more details.

Optionally, after the original input signal has been decomposed orthogonally by layer, the number of layer(s) of the orthogonal decomposition (i.e., the above-mentioned M) and the edge high-frequency bandwidth of the original input signal after the orthogonal decomposition (i.e., the bandwidth of the processed high-frequency signal at the $M^{th}$ layer) are known. An FIR filter can be generated according to the number of layers of the orthogonal decomposition and the edge high-frequency bandwidth of the original input signal after the orthogonal decomposition.

The bandwidth of the transition band of the filter is the same as the bandwidth of the transition band of the original input signal, the passband is the part of the effective signal on the edge sub-band, the relative bandwidth of the transition band becomes larger (a plurality of sub-band signals having small bandwidth would be obtained after the orthogonal decomposition of the original input signal by layer, and the bandwidth of the transition band remains unchanged, so the relative bandwidth of the transition band becomes larger), and the effective bandwidth of the signal is appropriate. Therefore, the order of the filter is low and a small quantity of resources is needed.

After the FIR filter is generated, the FIR filter is used to filter the edge high-frequency signal of the original input signal (i.e., the high-frequency signal at the $M^{th}$ layer).

For example, a signal whose sampling frequency is $f_s$ and whose transition band is $[f_{pass}, f_{stop}]$. After the signal is decomposed by layer, the edge high-frequency signal of the original input signal (i.e., the high-frequency signal at the $M^{th}$ layer) is filter by using the FIR filter. In other words, the frequency band $[f_s/2-f_s/2^{M+1}, f_s/2]$ of the original input signal is processed.

As illustrated by FIG. 3B, the high-frequency signal to be processed is interpolated by the factor of X. The spectrum of the interpolated high-frequency signal is shifted and then the signal is input into an orthogonal filter to obtain a high-frequency signal to be combined.

Baseband sampling of the target low-frequency signal (i.e., the low-frequency signal at the $M^{th}$ layer) is performed and then the signal is input into the low-frequency orthogonal filter to obtain a low-frequency signal to be combined.

The target low-frequency signal refers to the low-frequency signal at the highest decomposition layer after the orthogonal decomposition and it can be obtained in the following two ways.

1. Record the low-frequency signal(s) at each layer when the original input signal is decomposed orthogonally by layer, and then use the recorded low-frequency signal at the highest decomposition layer when combining the signals.

2. Calculate the low-frequency signals(s) at each layer of the orthogonal decomposition of the original input signal. For instance, the frequency band $[f_s/2-2*f_s/2^M, f_s/2-f_s/2^{M+1}]$ of Signal in the previous example represents the low-frequency signal at the highest layer. When combination at a lower layer is to be performed, the low-frequency signal at the lower layer needs to be calculated.

Baseband sampling of the target low-frequency signal is performed according to a certain sampling frequency, where the certain sampling frequency is the sampling frequency of the signal obtained through interpolating the high-frequency signal to be processed by the factor of X.

According to an implementation mode of the embodiment of the disclosure, inputting the high-frequency signal to be processed into the orthogonal filter to obtain the high-frequency signal to be combined includes inputting the high-frequency signal to be processed into the high-frequency orthogonal filter. And inputting the target low-frequency signal which has undergone baseband sampling into the other filter to obtain the low-frequency signal to be combined includes inputting the target low-frequency signal into the low-frequency orthogonal filter.

As illustrated by FIG. 3A, the low-frequency orthogonal filter may be a half-band filter and the high-frequency orthogonal filter may be an all-pass filter minus a half-band filter, that is the high-frequency orthogonal filter may be an inversion of half-band filter.

As illustrated by FIG. 3C, the high-frequency signal to be combined and the low-frequency signal to be combined are combined to get the combination signal, and the effect of combining signals is illustrated in FIG. 3D.

Suppose that a signal has a sampling frequency of $f_s$ and a transition band of $[f_{pass}, f_{stop}]$. The combination signal obtained through combining the low-frequency and high-frequency signals at the $M^{th}$ layer maps the frequency band $[f_s/2-f_s/2^M, f_s/2]$ of the original input signal. The sampling frequency of the combination signal is $f_s/2^{M-1}$, and the transition band of the combination signal is the same as the transition band of the original input signal.

Figure 3F:
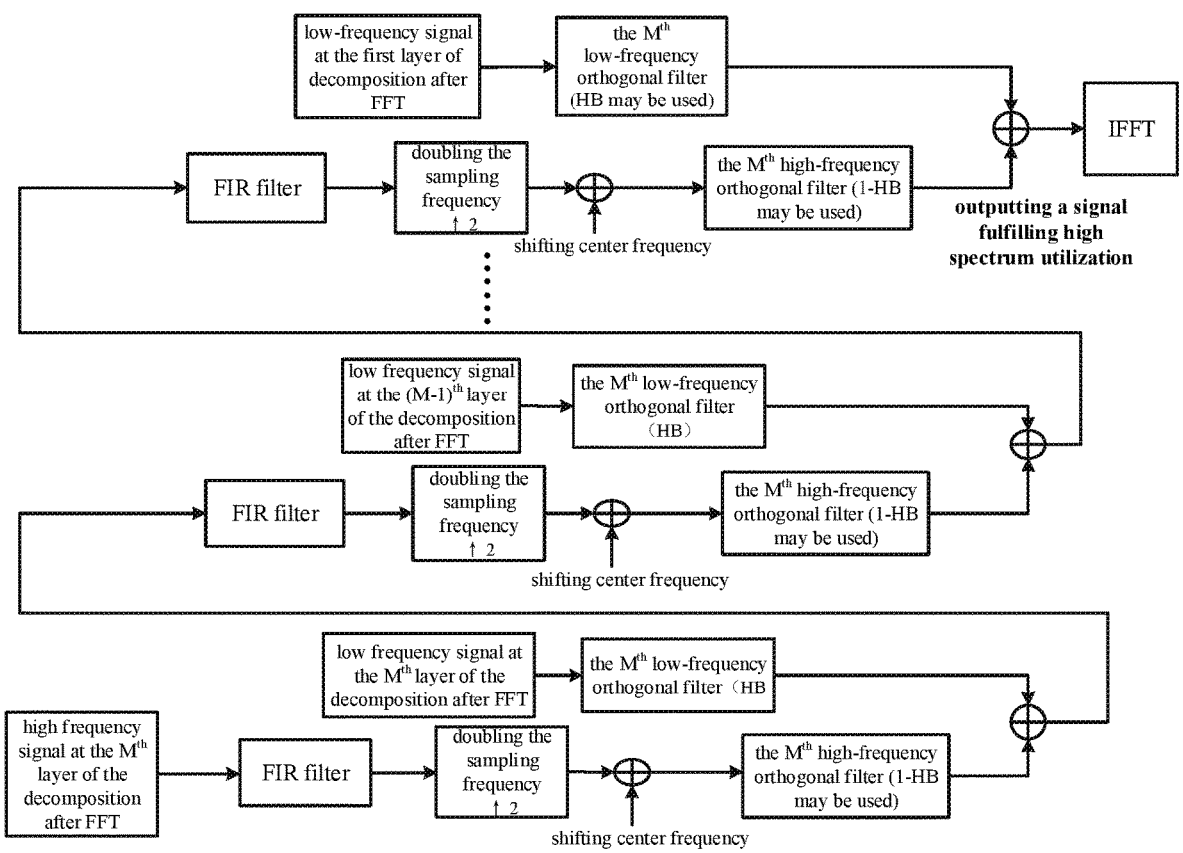
FIG. 3F is a schematic diagram of a second method for combining signals by layer according to an implementation mode of the embodiment of the disclosure.

Accordingly, as illustrated by FIG. 3F, after the low-frequency signal and the high-frequency signal at the $M^{th}$ layer are combined, the combination signal is used as the high-frequency signal at the $(M-1)^{th}$ layer by using the above-mentioned method. Return to the operation of interpolating the high-frequency signal to be processed by the factor of X and shifting the spectrum of the interpolated high-frequency signal so that the high-frequency and low-frequency signals at the $(M-1)^{th}$ layer can be combined. Repeat the process until the high-frequency and low-frequency signals at the first layer are combined.

The FIR filter in FIG. 3F is the above-mentioned FIR filter that can be generated according to the number of layers of orthogonal decomposition and the edge high-frequency bandwidth of the original input signal after the orthogonal decomposition. Doubling up-sampling refers to interpolation by a factor of 2. Up-conversion refers to the shifting of the spectrum before combination. As illustrated by FIG. 3F, after the combination signal at the $M^{th}$ layer is obtained, the combination signal is used as the high-frequency signal at the $(M-1)^{th}$ layer, and the low-frequency signal at the $(M-1)^{th}$ layer is obtained as mentioned above, and thus are not repeated here in more details. The process is repeated until the low-frequency signal and high-frequency signal at the first layer are combined.

Then the IFFT is performed on the signal obtained after processing at a $Y^{th}$ layer, where the $Y^{th}$ layer is the first layer of the M layers, and the signal obtained after processing at the $Y^{th}$ layer is the combination signal obtained through combining the low-frequency signal and high-frequency signal at the first layer of the M layers.

Figure 3G:
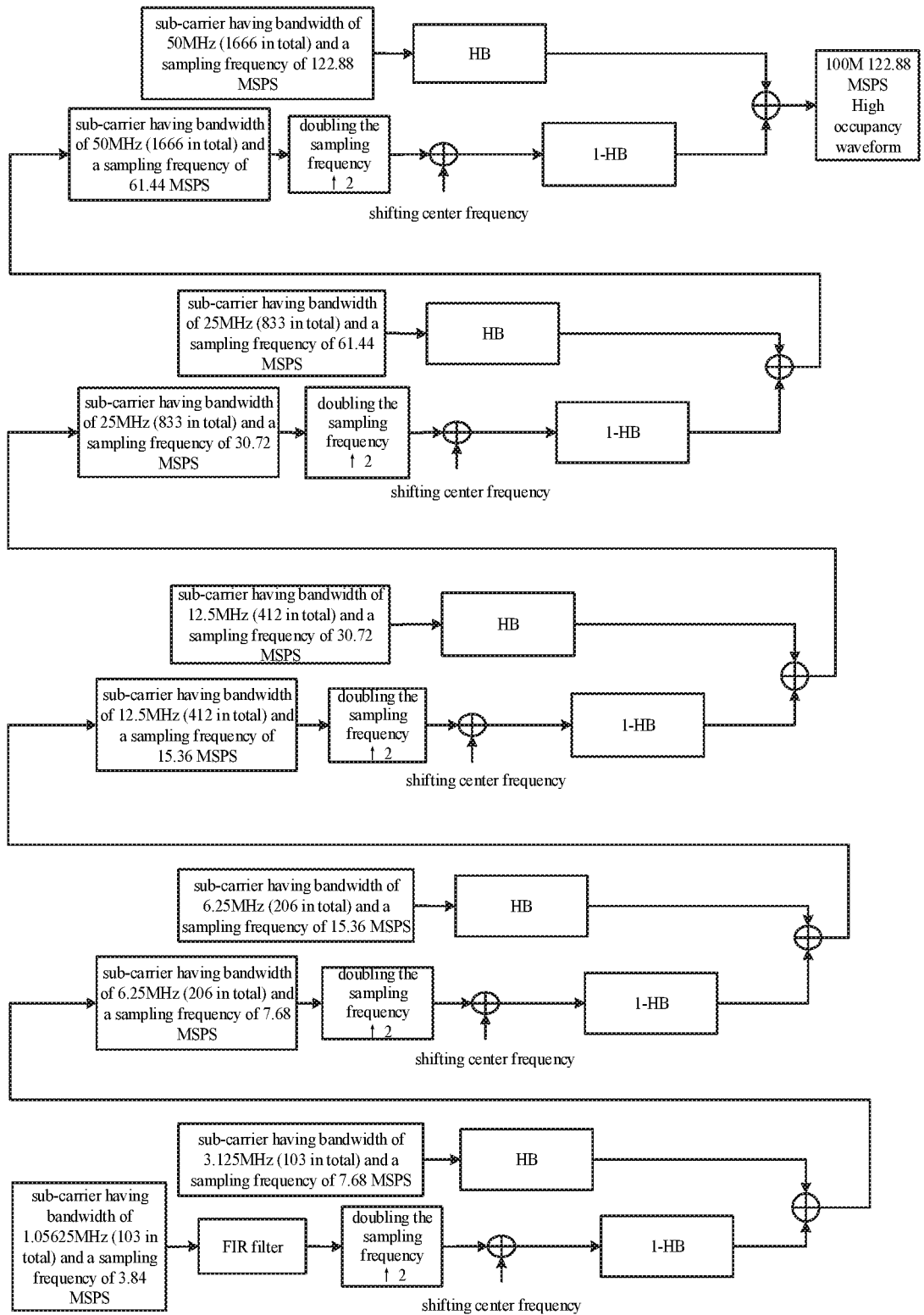
FIG. 3G is a schematic diagram of a structure of an exemplary 5G 100 MHz filter for combining signals according to an implementation mode of the embodiment of the disclosure.

A structure of an exemplary 5G filter having a bandwidth of 100 MHz for signal combination is illustrated by the FIG. 3G.

The methods for decomposition of the original input signal by layer and for combination of signals, illustrated by FIG. 3G, are the same as those described above, and thus are not repeated here in more details.

Figure 4:
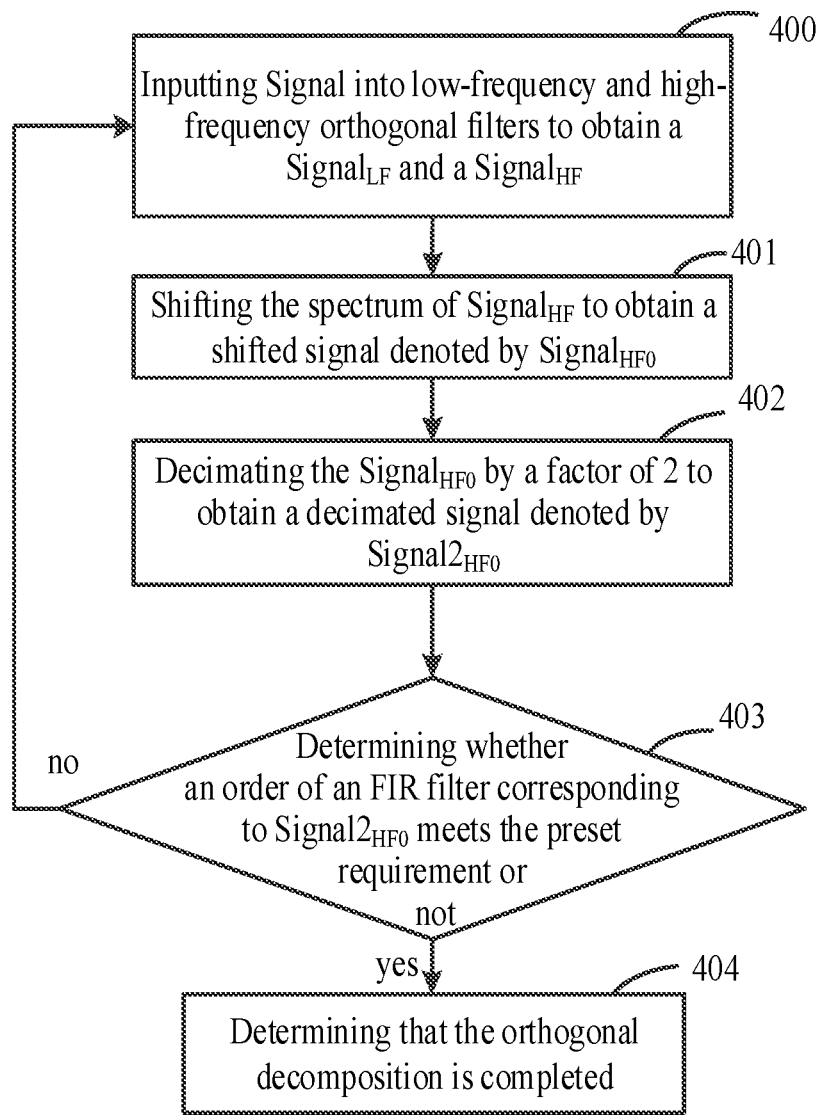
FIG. 4 is a flow chart of a method for decomposing an original input signal by layer orthogonally according to an implementation mode of the embodiment of the disclosure.

FIG. 4 illustrates a complete implementation mode for orthogonal decomposition, where the original input signal is denoted by Signal, the sampling frequency is $f_s$, the transition band is $[f_{pass}, f_{stop}]$, the spectrum of the signal is $[0, f_s/2]$ and the relative bandwidth of the transition band is $[f_{pass}/f_s, f_{stop}/f_s]$. Operation 400: inputting Signal into low-frequency and high-frequency orthogonal filters to obtain a low-frequency signal denoted by $Signal_{LF}$ and a high-frequency signal denoted by $Signal_{HF}$.

Operation 401: shifting the $Signal_{HF}$ to a zero-frequency signal by the way of spectrum transformation, where the zero-frequency signal is denoted by $Signal_{HF0}$. The specific implementation is based on the formula $signal_{HF} \times e^{-j2\pi f_s(t)}$.

Operation 402: decimating the $Signal_{HF0}$ by a factor of 2 to obtain a decimated signal denoted by $Signal2_{HF0}$.

Operation 403: determining whether an order of an FIR filter corresponding to the processed high-frequency signal at this layer, $Signal2_{HF0}$, meets the preset requirement or not, and if so, determining that the orthogonal decomposition is completed, otherwise returning to the operation 400.

Operation 404: determining that the orthogonal decomposition is completed.

Figure 5:
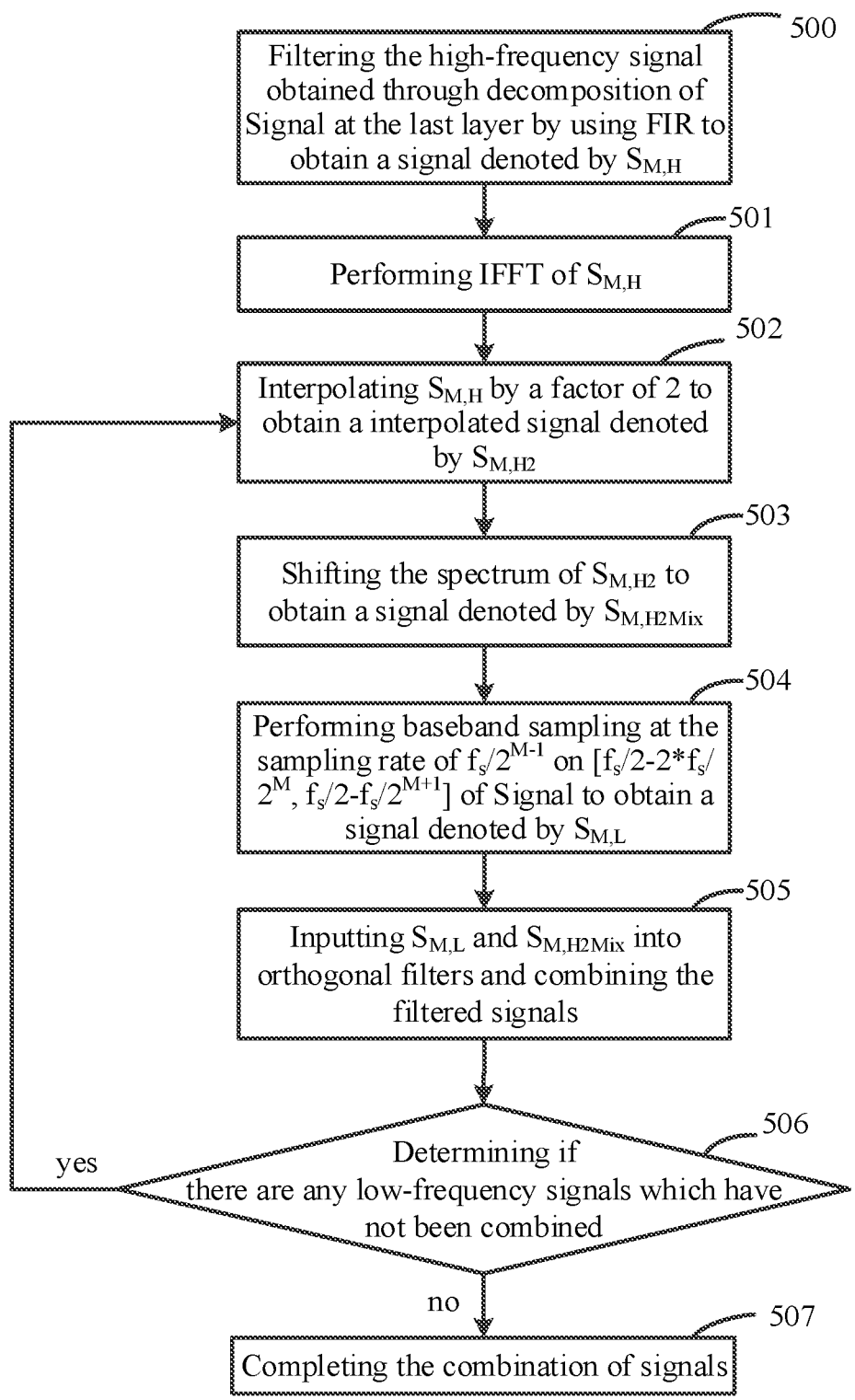
FIG. 5 is a flow chart of a first method for combining signals by layer according to an implementation mode of the embodiment of the disclosure.

FIG. 5 illustrates a complete implementation mode for combining signals.

Operation 500: filtering the high-frequency signal obtained through decomposition of Signal at the last layer (i.e., $[f_s/2-f_s/2^{M+1}, f_s/2]$ of Signal) by using an FIR filter to obtain a signal denoted by $S_{M,H}$.

Operation 501: performing IFFT of $S_{M,H}$.

Operation 502: interpolating $S_{M,H}$ by a factor of 2 to obtain a interpolated signal denoted by $S_{M,H2}$, where the sampling frequency of the signal becomes $f_s/2^{M-1}$ and the bandwidth of the signal is $[0,f_s/2^M]$ according to the Nyquist sampling theorem.

Operation 503: shifting the spectrum of $S_{M,H2}$ so that the center of the frequency of the signal moves to $f_s/2^{M-1}$ to obtain a signal denoted by $S_{M,H2Mix}$. That is, $[f_s/2-f_s/2^{M+1}, f_s/2]$ of Signal maps to $[f_s/2^{M-1}, f_s/2^M]$ of $S_{M,H2Mix}$. The bandwidth of $S_{M,H2Mix}$ is $[0, f_s/2^M]$ and the sampling rate is $f_s/2^{M-1}$.

Operation 504: performing baseband sampling at the sampling frequency of $f_s/2^{M-1}$ on $[f_s/2-2*f_s/2^M, f_s/2-f_s/2^{M+1}]$ of Signal to obtain a signal denoted by $S_{M,L}$. The frequency band $[f_s/2-2*f_s/2^M, f_s/2-f_s/2^{M+1}]$ is the low-frequency signal obtained at the highest layer of the orthogonal decomposition of Signal.

Operation 505: inputting $S_{M,L}$ and $S_{M,H2Mix}$ into orthogonal filters and combining the filtered signals to obtain a combination signal denoted by $S_{M-1}$, which maps the frequency band $[f_s/2-f_s/2^M, f_s/2]$ of Signal. The sampling frequency is now $f_s/2^{M-1}$ and the transition band of the combination signal is the same as the transition band of the original input signal.

Operation 506: determining if there are any low-frequency signals which have not been combined. If so, using the combination signal as the high-frequency signal to be processed and returning to the operation 502. Otherwise, completing the combination of signals.

Operation 507: Completing the combination of signals.

Figure 6:
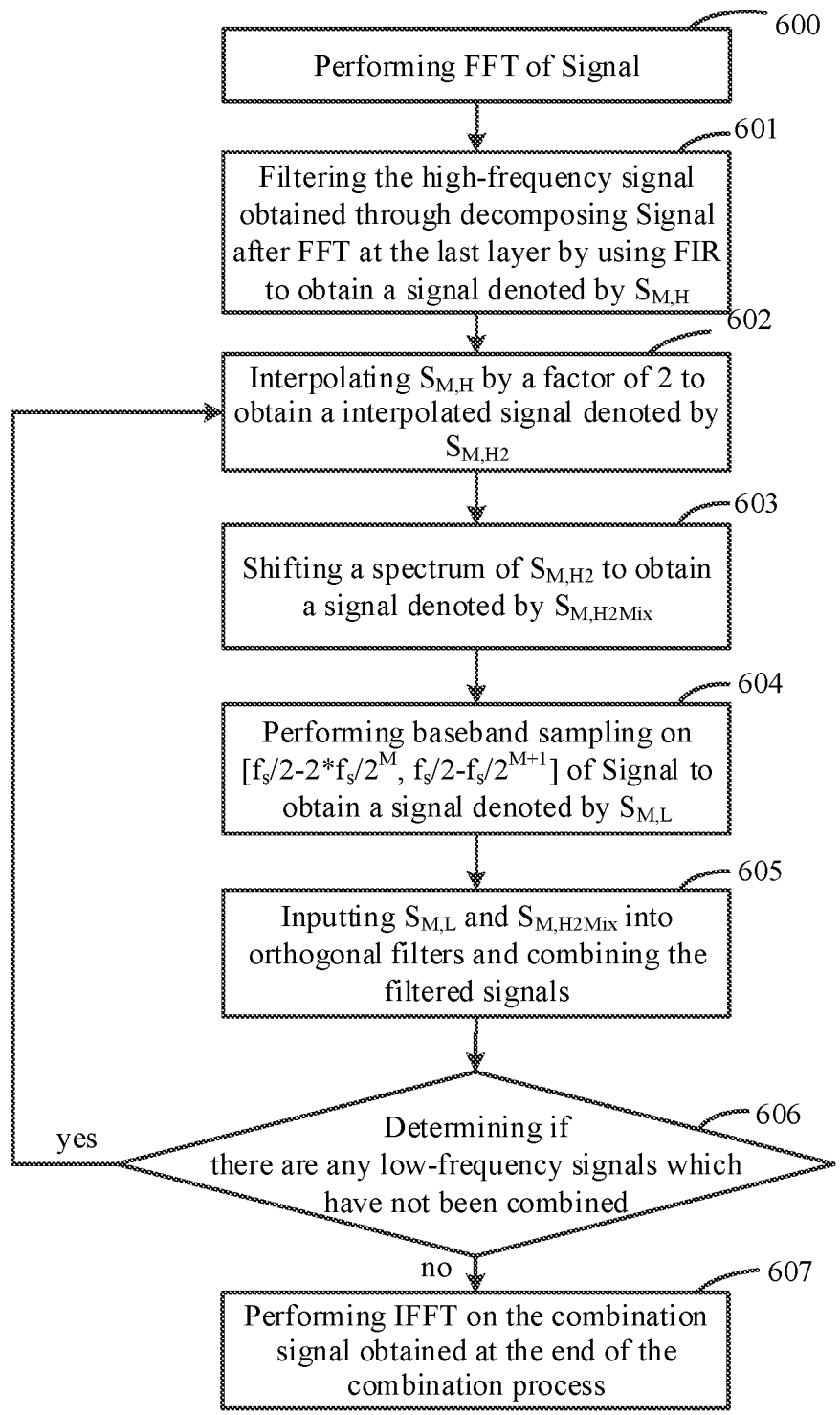
FIG. 6 is a flow chart of a second method for combining signals by layer according to an implementation mode of the embodiment of the disclosure.

FIG. 6 illustrates another implementation mode of the embodiment of the disclosure for combining signals.

Operation 600: performing FFT of Signal.

Operation 601: filtering the high-frequency signal obtained through decomposing Signal after FFT at the last layer (i.e., $[f_s/2-f_s/2^{M+1}, f_s/2]$ of Signal) by using an FIR filter to obtain a signal denoted by $S_{M,H}$.

Operation 602: interpolating $S_{M,H}$ by a factor of 2 to obtain a interpolated signal denoted by $S_{M,H2}$, where the sampling frequency of the signal becomes $f_s/2^{M-1}$ and the bandwidth of the signal is $[0,f_s/2^M]$ according to the Nyquist sampling theorem.

Operation 603: shifting a spectrum of $S_{M,H2}$ so that its center frequency moves to $f_s/2^{M-1}$ to obtain a signal denoted by $S_{M,H2Mix}$. That is, $[f_s/2-f_s/2^{M+1}, f_s/2]$ of Signal is mapped to a frequency band of $[f_s/2^{M+1}, f_s/2^M]$ of signal $S_{M,H2Mix}$, whose bandwidth is $[0, f_s/2^M]$, and the sampling frequency becomes $f_s/2^{M-1}$.

Operation 604: performing baseband sampling at the sampling frequency of $f_s/2^{M-1}$ on $[f_s/2-2*f_s/2^M, f_s/2-f_s/2^{M+1}]$ of Signal to obtain a signal denoted by $S_{M,L}$.

Operation 605: inputting $S_{M,L}$ and $S_{M,H2Mix}$ into orthogonal filters and combining the filtered signals to obtain a combination signal denoted by $S_{M-1}$, which maps the frequency band $[f_s/2-f_s/2^M, f_s/2]$ of Signal. The sampling rate is now $f_s/2^{M-1}$ and the transition band of the combination signal is the same as the transition band of the original input signal.

Operation 606: determining if there are any low-frequency signals which have not been combined. If so, using the combination signal as the high-frequency signal to be processed and returning to the operation 602. Otherwise, performing the operation 607.

Operation 607: performing IFFT on the combination signal obtained at the end of the combination process.

Based on the same inventive conception, an embodiment of the disclosure also provides a device for designing a filter. Since the method corresponding to the device is the method for designing the filter according to the embodiment of the disclosure, and the device solves the problems in the same way as the method, please refer to the implementation of the method for the implementation of the device.

Figure 7:
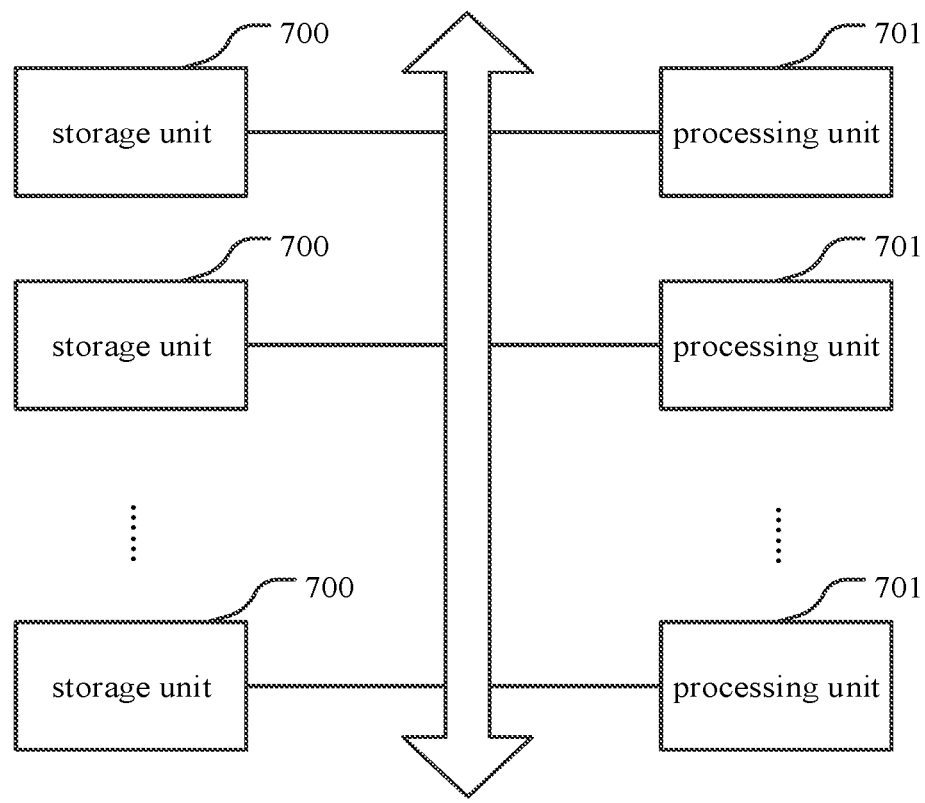
FIG. 7 is a schematic diagram of a structure of an apparatus for signal processing according to an embodiment of the disclosure.

FIG. 7 illustrates an apparatus for signal processing according to an embodiment of the disclosure. The apparatus includes at least one storage unit 700 and at least one processing unit 701. The at least one storage unit stores program code. The at least one processing unit 701 is configured to execute the program code to:

decompose an original input signal orthogonally by layer;

generate an FIR filter according to number of layers of orthogonal decomposition and spectral edge high-frequency bandwidth of the original input signal after the orthogonal decomposition;

filter an edge high-frequency signal of the original input signal by using the FIR filter; and input a signal obtained through the filtering and one or more low-frequency signals obtained through the orthogonal decomposition of each layer into orthogonal filters and then combine signals output by the orthogonal filters.

Optionally, the at least one processing unit 701 is further configured to:

decompose the original input signal orthogonally to obtain a high-frequency signal at a layer and a low-frequency signal at the layer;

shift the high-frequency signal at the layer to a zero-frequency signal at the layer and then decimate the zero-frequency signal at the layer by a factor of N to obtain a processed high-frequency signal at the layer;

determine that the orthogonal decomposition is completed when the order meets the preset requirement; or, decompose the processed high-frequency signal at the layer orthogonally to obtain a high-frequency signal at another layer and a low-frequency signal at the another layer, and shift the high-frequency signal at the another layer to a zero-frequency signal at the another layer and then decimating the zero-frequency signal at the another layer by the factor of N, when the order does not meet the preset requirement.

Optionally, the at least one processing unit 701 is further configured to:

filter the zero-frequency signal at the layer by a filter having an order lower than a preset value after shifting the high-frequency signal at the layer to the zero-frequency signal at the layer and before decimating the zero-frequency signal at the layer by the factor of N to obtain the processed high-frequency signal at the layer.

Optionally, the at least one processing unit 701 is further configured to:

use the signal obtained through the filtering as a high-frequency signal to be processed;

interpolate the high-frequency signal to be processed by a factor of X, shift a spectrum of interpolated signal, and then input shifted signal into a high-frequency orthogonal filter to obtain a high-frequency signal to be combined; perform baseband sampling of a target low-frequency signal and then input sampled signal into a low-frequency orthogonal filter to obtain a low-frequency signal to be combined, where the target low-frequency signal is a low-frequency signal at a highest decomposition layer among low-frequency signals which are obtained after the orthogonal decomposition of each layer and which have not been combined with the high-frequency signal to be combined;

combine the high-frequency signal to be combined and the low-frequency signal to be combined to obtain a combination signal;

determine if there is any low-frequency signal which has not been combined with a high-frequency signal to be combined, and when there is, use the combination signal as a new high-frequency signal to be processed, interpolate the new high-frequency signal to be processed by the factor of X and then shifting the spectrum of interpolated signal, otherwise complete signal combination process.

Optionally, the at least one processing unit 701 is further configured to: perform IFFT of the high-frequency signal to be processed or the new high-frequency signal to be processed before interpolating the high-frequency signal to be processed or the new high-frequency signal to be processed by the factor of X and then shift the spectrum of the interpolated signal.

Optionally, the at least one processing unit 701 is further configured to:

perform IFFT of the sampled low-frequency signal after zero-padding and insert a CP into the signal having undergone IFFT, after performing baseband sampling of the target low-frequency signal and before inputting the sampled signal into the low-frequency orthogonal filter.

Optionally, the at least one processing unit 701 is further configured to:

perform FFT of the original input signal before orthogonally decomposing the original input signal by layer.

Optionally, the at least one processing unit 701 is further configured to:

perform IFFT of the signal output by the orthogonal filters after inputting the signal obtained through the filtering and the one or more low-frequency signals obtained through the orthogonal decomposition of each layer into the orthogonal filters and then combining the signals output by the orthogonal filters.

Optionally, the orthogonal filters include a high-frequency orthogonal filter and a low-frequency orthogonal filter, the high-frequency orthogonal filter is an all-pass filter minus a half-band filter and the low-frequency orthogonal filter is a half-band filter.

Figure 8:
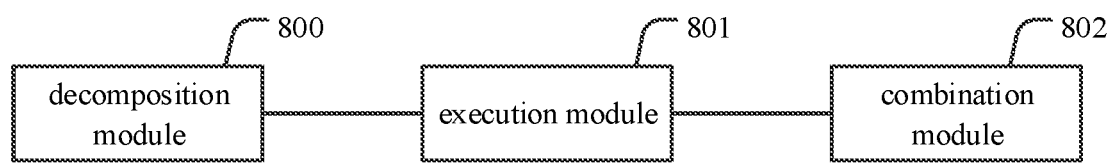
FIG. 8 is a schematic diagram of a structure of another apparatus for signal processing according to an embodiment of the disclosure.

FIG. 8 illustrates an apparatus for signal processing according to an embodiment of the disclosure. The device includes a decomposition module 800; which is configured to decompose an original input signal orthogonally by layer; an execution module 801, which is configured to generate an FIR filter according to number of layers of orthogonal decomposition and edge high-frequency bandwidth of the original input signal after the orthogonal decomposition, and filter an edge high-frequency signal of the original input signal by using the FIR filter; a combination module 802, which is configured to input a signal obtained through the filtering and one or more low-frequency signals obtained through the orthogonal decomposition of each layer into orthogonal filters, and then combine signals output by the orthogonal filters.

Optionally, the execution module 801 is further configured to:

decompose the original input signal orthogonally to obtain a high-frequency signal at a layer and a low-frequency signal at the layer;

shift the high-frequency signal at the layer to a zero-frequency signal at the layer and then decimate the zero-frequency signal at the layer by a factor of N to obtain a processed high-frequency signal at the layer;

determine if an order of a filter corresponding to the processed high-frequency signal at the layer meets a preset requirement or not; and determine that the orthogonal decomposition is completed when the order meets the preset requirement; or, decompose the processed high-frequency signal at the layer orthogonally to obtain a high-frequency signal at another layer and a low-frequency signal at the another layer, and shift the high-frequency signal at the another layer to a zero-frequency signal at the another layer and then decimating the zero-frequency signal at the another layer by the factor of N, when the order does not meet the preset requirement.

Optionally, the execution module 801 is further configured to:

filter the zero-frequency signal at the layer by a filter having an order lower than a preset value after shifting the high-frequency signal at the layer to the zero-frequency signal at the layer and before decimating the zero-frequency signal at the layer by the factor of N to obtain the processed high-frequency signal at the layer.

Optionally, the execution module 801 is further configured to:

perform FFT of the original input signal before orthogonally decomposing the original input signal by layer.

Optionally, the execution module 801 is further configured to:

perform IFFT of the signal output by the orthogonal filters after inputting the signal obtained through the filtering and the one or more low-frequency signals obtained through the orthogonal decomposition of each layer into the orthogonal filters and then combining the signals output by the orthogonal filters.

Optionally, the combination module 802 is further configured to:

use the signal obtained through the filtering as a high-frequency signal to be processed;

interpolate the high-frequency signal to be processed by a factor of X, shift a spectrum of interpolated signal, and then input shifted signal into a high-frequency orthogonal filter to obtain a high-frequency signal to be combined; perform baseband sampling of a target low-frequency signal and then input sampled signal into a low-frequency orthogonal filter to obtain a low-frequency signal to be combined, where the target low-frequency signal is a low-frequency signal at a highest decomposition layer among low-frequency signals which are obtained after the orthogonal decomposition of each layer and which have not been combined with the high-frequency signal to be combined;

combine the high-frequency signal to be combined and the low-frequency signal to be combined to obtain a combination signal;

determine if there is any low-frequency signal which has not been combined with a high-frequency signal to be combined, and when there is, use the combination signal as a new high-frequency signal to be processed, interpolate the new high-frequency signal to be processed by the factor of X and then shifting the spectrum of interpolated signal, otherwise complete signal combination process.

Optionally, the combination module 802 is further configured to: perform IFFT of the high-frequency signal to be processed or the new high-frequency signal to be processed before interpolating the high-frequency signal to be processed or the new high-frequency signal to be processed by the factor of X and then shift the spectrum of the interpolated signal.

Optionally, the combination module 802 is further configured to:

perform IFFT of the sampled low-frequency signal after zero-padding and insert a CP into the signal having undergone IFFT, after performing baseband sampling of the target low-frequency signal and before inputting the sampled signal into the low-frequency orthogonal filter.

Optionally, the orthogonal filters include a high-frequency orthogonal filter and a low-frequency orthogonal filter, the high-frequency orthogonal filter is an all-pass filter minus a half-band filter and the low-frequency orthogonal filter is a half-band filter.

The disclosure has been described in a flow chart and/or a block diagram of the method, the apparatus (system) and the computer program product according to the embodiments of the disclosure. It shall be appreciated that respective flows and/or blocks in the flow chart and/or the block diagram and combinations of the flows and/or the blocks in the flow chart and/or the block diagram can be embodied in computer program instructions. These computer program instructions can be loaded onto a general-purpose computer, a specific-purpose computer, an embedded processor or a processor of another programmable data processing apparatus to produce a machine so that the instructions executed on the computer or the processor of the other programmable data processing apparatus create means for performing the functions specified in the flow(s) of the flow chart and/or the block(s) of the block diagram.

Accordingly, the embodiments of the disclosure may be implemented by hardware and/or software (including accordingly, the application can also be implemented with hardware and/or software (including firmware, resident software, microcode, and etc.). Furthermore, the embodiments of the disclosure may be implemented by a computer program product on a computer-usable or computer-readable storage medium, and the computer program product has computer-usable or computer-readable program codes implemented in the medium for use by an instruction execution system or in conjunction with the instruction execution system. In the context of the disclosure, a computer-usable or computer-readable medium may be any medium that can contain, store, communicate, transmit, or transfer a program for use by or in connection with an instruction execution system, apparatus, or device.

Evidently those skilled in the art can make various modifications and variations to the disclosure without departing from the spirit and scope of the disclosure. Thus the disclosure is also intended to encompass these modifications and variations thereto so long as the modifications and variations come into the scope of the claims appended to the disclosure and their equivalents.

What is claimed is:

1. A method for signal processing, comprising:

performing a multistage orthogonal decomposition for an original input signal to obtain multiple sub-band signals having small bandwidth; wherein the performing the multistage orthogonal decomposition for the original input signal to obtain the multiple sub-band signals with having small bandwidth comprises:

decomposing the original input signal orthogonally to obtain a high-frequency sub-band signal in a first stage and a low-frequency sub-band signal in the first stage, wherein a sampling frequency distribution of the original input signal is $f_s$, a frequency distribution of the high-frequency sub-band signal is $$\left(\frac{1}{2}f_s, f_s\right],$$

and a frequency distribution of the low-frequency sub-band signal is $$\left[0, \frac{1}{2}f_s\right];$$

shifting the high-frequency sub-band signal in the first stage to a zero-frequency sub-band signal in the first stage and then extracting the zero-frequency sub-band signal in the first stage by a factor of N to obtain a processed high-frequency sub-band signal in the first stage;

determining if a first filter corresponding to the processed high-frequency sub-band signal in the first stage meets a preset requirement or not, wherein the preset requirement is that a bandwidth of a transition band of the first filter relative to a bandwidth of the processed high-frequency sub-band signal ranges from 20% to 30%; and when the first filter meets the preset requirement, determining that the multistage orthogonal decomposition is completed;

when the first filter does not meet the preset requirement, repeating the first stage for a processed high-frequency sub-band signal in $M^{th}$ stage until a first filter corresponding to a processed high-frequency sub-band signal in $(M+1)^{th}$ stage meets the preset requirement, wherein M>=1;

filtering an edge high-frequency sub-band signal of the original input signal by using the first filter as a finite impulse response, FIR, filter, wherein the edge high-frequency sub-band is the processed high-frequency sub-band signal in the first stage when the first filer corresponding to the processed high-frequency sub-band signal in the first stage meets the preset requirement, or the edge high-frequency sub-band is the processed high-frequency sub-band signal in the $(M+1)^{th}$ stage when the first filter corresponding to the processed high-frequency sub-band signal in the first stage does not meet the preset requirement; and inputting a signal obtained through filtering the edge high-frequency sub-band signal and a low-frequency sub-band signal obtained through orthogonal decomposition in each stage into a quadrature filter bank and then combining signals output by the quadrature filter bank;

wherein inputting the signal obtained through filtering the edge high-frequency sub-band signal and a low-frequency sub-band signal obtained through orthogonal decomposition in each stage into a quadrature filter bank and then combining signals output by the quadrature filter bank comprises:

using the signal obtained through filtering the edge high-frequency sub-band signal as a high-frequency sub-band signal to be processed;

interpolating the high-frequency sub-band signal to be processed by a factor of X, shifting a spectrum of interpolated signal to shift a center of the interpolated signal to $f_s/2^{Y-1}$, wherein Y is a number of a last stage of the multistage orthogonal decomposition, and then inputting shifted signal into a high-frequency quadrature filter for filtering the shifted signal to obtain a high-frequency sub-band signal to be combined; performing baseband sampling of a target low-frequency sub-band signal and then inputting sampled signal into a low-frequency quadrature filter for filtering the sampled signal to obtain a low-frequency sub-band signal to be combined, wherein the target low-frequency sub-band signal is a uncombined low-frequency sub-band signal with a highest number of stages after the multistage orthogonal decomposition;

combining the high-frequency sub-band signal to be combined and the low-frequency sub-band signal to be combined to obtain a combination signal; and determining if there is any low-frequency sub-band signal which has not been combined with a high-frequency sub-band signal to be combined, and when there is, using the combination signal as a new high-frequency sub-band signal to be processed, and using a low-frequency sub-band signal, with a highest number of stages, in one or more low-frequency sub-band signals which have not been combined with the high-frequency sub-band signal to be combined, as a new target low-frequency sub-band signal, and performing the previous inputting and combining process for the new high-frequency sub-band signal to be processed and the new target low-frequency sub-band signal with repetition until there is no uncombined low-frequency sub-band signal, otherwise completing signal combination process.

2. The method according to claim 1, after shifting the high-frequency sub-band signal in the first stage to a zero-frequency sub-band signal in the first stage and before extracting the zero-frequency sub-band signal in the first stage by the factor of N to obtain the processed high-frequency sub-band signal, further comprising:

filtering the zero-frequency sub-band signal in the first stage by a filter having an order lower than a preset value.

3. The method according to claim 1, before interpolating the high-frequency sub-band signal to be processed or the new high-frequency sub-band signal to be processed by the factor of X and then shifting a spectrum of an interpolated signal, further comprising:

performing inverse fast Fourier transform (IFFT) of the high-frequency sub-band signal to be processed or the new high-frequency sub-band signal to be processed.

4. The method according to claim 1, after performing baseband sampling of the target low-frequency sub-band signal or the new target low-frequency sub-band signal and before inputting the sampled signal into the low-frequency quadrature filter, further comprising:

performing IFFT of the sampled low-frequency sub-band signal after zero-padding, and inserting a cyclic prefix (CP) into signal having undergone the IFFT.

5. The method according to claim 1, before performing the multistage orthogonal decomposition for the original input signal, further comprising:

performing fast Fourier transform (FFT) of the original input signal.

6. The method according to claim 5, after inputting the signal obtained through filtering the edge high-frequency sub-band signal and the low-frequency sub-band signal obtained through the orthogonal decomposition in each stage into the quadrature filter bank and then combining the signals output by the quadrature filter bank, further comprising:

performing IFFT of a signal which is obtained after combining the signals output by the quadrature filter bank.

7. The method according to claim 1, wherein the quadrature filter bank comprises the high-frequency quadrature filter and the low-frequency quadrature filter, the high-frequency quadrature filter is an all-pass filter minus a half-band filter and the low-frequency quadrature filter is a half-band filter.

8. An apparatus for signal processing, comprising:
at least one processing unit; and
at least one storage unit storing instructions;
wherein the at least one processing unit is configured to execute instructions to:
perform a multistage orthogonal decomposition for an original input signal to obtain multiple sub-band signals having small bandwidth; wherein the at least one processing unit is further configured to:
decompose the original input signal orthogonally to obtain a high-frequency sub-band signal in a first stage and a low-frequency sub-band signal in the first stage, wherein a sampling frequency distribution of the original input signal is $f_s$, a frequency distribution of the high-frequency sub-band signal is $$\left(\frac{1}{2}f_s, f_s\right],$$

and a frequency distribution of the low-frequency sub-band signal is $$\left[0, \frac{1}{2}f_s\right];$$

shift the high-frequency sub-band signal in the first stage to a zero-frequency sub-band signal in the first stage and then extract the zero-frequency sub-band signal in the first stage by a factor of N to obtain a processed high-frequency sub-band signal in the first stage;

determine if a first filter corresponding to the processed high-frequency sub-band signal in the first stage meets a preset requirement or not, wherein the preset requirement is that a bandwidth of a transition band of the first filter relative to a bandwidth of the processed high-frequency sub-band signal ranges from 20% to 30%; and when the first filter meets the preset requirement, determine that the multistage orthogonal decomposition is completed;

when the first filter does not meet the preset requirement, repeat the first stage for a processed high-frequency sub-band signal in $M^{th}$ stage until a first filter corresponding to a processed high-frequency sub-band signal in $(M+1)^{th}$ stage meets the preset requirement, wherein M>=1;

filter an edge high-frequency sub-band signal of the original input signal by using the first filter as a finite impulse response, FIR, filter, wherein the edge high-frequency sub-band is the processed high-frequency sub-band signal in the first stage when the first filer corresponding to the processed high-frequency sub-band signal in the first stage meets the preset requirement, or the edge high-frequency sub-band is the processed high-frequency sub-band signal in the $(M+1)^{th}$ stage when the first filter corresponding to the processed high-frequency sub-band signal in the first stage does not meet the preset requirement; and input a signal obtained through filtering the edge high-frequency sub-band signal and a low-frequency sub-band signal obtained through orthogonal decomposition in each stage into a quadrature filter bank and then combine signals output by the quadrature filter bank;

wherein the at least one processing unit is further configured to:

use the signal obtained through filtering the edge high-frequency sub-band signal as a high-frequency sub-band signal to be processed;

interpolate the high-frequency sub-band signal to be processed by a factor of X, shift a spectrum of interpolated signal to shift a center of the interpolated signal to $f_s/2^{Y-1}$, wherein Y is a number of a last stage of the multistage orthogonal decomposition, and then input shifted signal into a high-frequency quadrature filter for filtering the shifted signal to obtain a high-frequency sub-band signal to be combined; perform baseband sampling of a target low-frequency sub-band signal and then input sampled signal into a low-frequency quadrature filter for filtering the sampled signal to obtain a low-frequency sub-band signal to be combined, wherein the target low-frequency sub-band signal is a uncombined low-frequency sub-band signal with a highest number of stages after the multistage orthogonal decomposition;

combine the high-frequency sub-band signal to be combined and the low-frequency sub-band signal to be combined to obtain a combination signal; and determine if there is any low-frequency sub-band signal which has not been combined with a high-frequency sub-band signal to be combined, and when there is, use the combination signal as a new high-frequency sub-band signal to be processed, and use a low-frequency sub-band signal, with a highest number of stages, in one or more low-frequency sub-band signals which have not been combined with the high-frequency sub-band signal to be combined, as a new target low-frequency sub-band signal, and perform the previous inputting and combine process for the new high-frequency sub-band signal to be processed and the new target low-frequency sub-band signal with repetition until there is no uncombined low-frequency sub-band signal, otherwise complete signal combination process.

9. The apparatus according to claim 8, wherein the at least one processing unit is further configured to:

filter the zero-frequency sub-band signal in the first stage by a filter having an order lower than a preset value after shifting the high-frequency sub-band signal in the first stage to the zero-frequency sub-band signal in the first stage and before extracting the zero-frequency sub-band signal in the first stage by the factor of N to obtain the processed high-frequency signal in the first stage.

10. The apparatus according to claim 8, wherein the at least one processing unit is further configured to:

perform IFFT of the high-frequency sub-band signal to be processed or the new high-frequency sub-band signal to be processed before interpolating the high-frequency sub-band signal to be processed or the new high-frequency sub-band signal to be processed by the factor of X and then shift a spectrum of an interpolated signal.

11. The apparatus according to claim 8, wherein the at least one processing unit is further configured to:

perform IFFT of the sampled low-frequency sub-band signal after zero-padding and insert a CP into the signal having undergone IFFT, after performing baseband sampling of the target low-frequency sub-band signal or the new target low-frequency sub-band signal and before inputting a sampled signal into the low-frequency quadrature filter.

12. The apparatus according to claim 8, wherein the at least one processing unit is further configured to:

perform FFT of the original input signal before performing the multistage orthogonal decomposition for decomposing the original input signal.

13. The apparatus according to claim 12, wherein the at least one processing unit is further configured to:

perform IFFT of a signal which is obtained after combining the signal output by the quadrature filter bank after inputting the signal obtained through filtering the edge high-frequency sub-band signal and the a low-frequency signals obtained through the orthogonal decomposition in each stage into the quadrature filter bank and then combining the signals output by the quadrature filter bank.

14. The apparatus according to claim 8, wherein the quadrature filter bank comprises the high-frequency quadrature filter bank and the low-frequency quadrature filter bank, the high-frequency quadrature filter bank is an all-pass filter minus a half-band filter and the low-frequency quadrature filter bank is a half-band filter.

* * * * *